US008288211B2

(12) United States Patent
Foster et al.

(10) Patent No.: US 8,288,211 B2
(45) Date of Patent: Oct. 16, 2012

(54) WAFER LEVEL HERMETIC BOND USING METAL ALLOY WITH KEEPER LAYER

(75) Inventors: John S. Foster, Santa Barbara, CA (US); Alok Paranjpye, Santa Barbara, CA (US); Douglas L. Thompson, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 12/923,872

(22) Filed: Oct. 13, 2010

(65) Prior Publication Data

US 2011/0024923 A1 Feb. 3, 2011

Related U.S. Application Data

(63) Continuation-in-part of application No. 12/459,956, filed on Jul. 11, 2009, which is a continuation-in-part of application No. 11/304,601, filed on Dec. 16, 2005, now Pat. No. 7,569,926, which is a continuation-in-part of application No. 11/211,622, filed on Aug. 26, 2005, now abandoned.

(51) Int. Cl.
*H01L 21/00* (2006.01)

(52) U.S. Cl. .......... 438/127; 438/106; 438/107; 438/51; 257/787; 257/E21.536; 257/E23.124

(58) Field of Classification Search ................. 257/787, 257/E21.495, E21.536, E23.124; 438/18, 438/106, 51, 107, 127
See application file for complete search history.

(56) References Cited

U.S. PATENT DOCUMENTS

| 6,137,184 | A * | 10/2000 | Ikegami | 257/785 |
| 2003/0104651 | A1* | 6/2003 | Kim et al. | 438/106 |
| 2005/0093134 | A1* | 5/2005 | Tarn | 257/706 |
| 2005/0250253 | A1* | 11/2005 | Cheung | 438/125 |
| 2006/0125084 | A1* | 6/2006 | Fazzio et al. | 257/704 |

* cited by examiner

*Primary Examiner* — Olik Chaudhuri
*Assistant Examiner* — Wilner Jean Baptiste
(74) *Attorney, Agent, or Firm* — Jaquelin K. Spring

(57) ABSTRACT

Systems and methods for forming an encapsulated device include a hermetic seal which seals an insulating environment between two substrates, one of which supports the device. The hermetic seal is formed by an alloy of two metal layers, one deposited on a first substrate and the other deposited on the second substrate. At least one of the substrates may include a raised feature formed under at least one of the metal layers. One of the metal layer may have a diffusion barrier layer and a "keeper" layer formed thereover, wherein the keeper layers keeps the metal confined to a particular area. By using such a "keeper" layer, the substrate components may be heated to clean their surfaces, without activating or spending the bonding mechanism.

21 Claims, 21 Drawing Sheets

WAFER LEVEL HERMETIC BOND USING METAL ALLOY WITH KEEPER LAYER

CROSS REFERENCE TO RELATED APPLICATIONS

This U.S. Patent Application is a continuation-in-part of U.S. patent application Ser. No. 12/459,956 filed Jul. 11, 2009, which is a continuation-in-part of U.S. patent application Ser. No. 11/304,601 filed Dec. 16, 2005, now U.S. Pat. No. 7,569,926 which is a continuation-in-part of U.S. patent application Ser. No. 11/211,622 filed Aug. 26, 2005, now abandoned. Each of these applications is incorporated by reference in their entireties.

STATEMENT REGARDING FEDERALLY SPONSORED RESEARCH

Not applicable.

STATEMENT REGARDING MICROFICHE APPENDIX

Not applicable.

BACKGROUND

This invention relates to the sealing of microelectromechanical systems (MEMS) devices in an enclosure and the method of manufacture of the sealed enclosure. In particular, this invention relates to the formation of a hermetic seal between a fabrication wafer supporting the MEMS devices, and a lid wafer.

Microelectromechanical systems (MEMS) are devices often having moveable components which are manufactured using lithographic fabrication processes developed for producing semiconductor electronic devices. Because the manufacturing processes are lithographic, MEMS devices may be batch fabricated in very small sizes. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) device wafers, which are a relatively thick silicon "handle" wafer with a thin silicon dioxide insulating layer, followed by a relatively thin silicon "device" layer. In the MEMS switches, a thin cantilevered beam of silicon is etched into the silicon device layer, and a cavity is created adjacent to the cantilevered beam, typically by etching the thin silicon dioxide layer to allow for the electrostatic deflection of the beam. Electrodes provided above or below the beam may provide the voltage potential which produces the attractive (or repulsive) force to the cantilevered beam, causing it to deflect within the cavity.

Because the MEMS devices often have moveable components, such as the cantilevered beam, they typically require protection of the moveable portions by sealing the devices in a protective cap or lid wafer, to form a device cavity. The lid wafer may be secured to the device wafer by some adhesive means, such as a low outgassing epoxy. FIG. 1 shows an embodiment of an exemplary epoxy bond in a MEMS assembly 1. To achieve the epoxy bond, a layer of epoxy 20 is deposited on a cap or lid wafer 10, or on the fabrication wafer 30, around the perimeter of the MEMS device 34. The assembly 1 is then heated or the epoxy otherwise cured with wafer 10 pressed against the fabrication wafer 30, until a bond is formed between the cap or lid wafer 10 and the fabrication wafer 30. The bond forms a device cavity 40 which surrounds the MEMS device 34. The assembly 1 may then be diced to separate the individual MEMS devices 34.

SUMMARY

However, the epoxy bond may not be hermetic, such that the gas with which the MEMS device is initially surrounded during fabrication, escapes over time and may be replaced by ambient air. In particular, if the MEMS device is an electrostatic MEMS switch is intended to handle relatively high voltages, such as those associated with telephone signals, the voltages may exceed, for example, about 400 V. For these relatively high voltages, it may be desirable to seal the electrostatic MEMS switch in a high dielectric strength environment, for example, an electrically insulating gas environment, to discourage breakdown of the air and arcing between the high voltage lines. To this end, it may be desirable to seal a high dielectric strength gas or electrically insulating environment such as sulphur hexafluoride ($SF_6$), helium (He) or a freon such as $CCl_2F_2$ or $C_2Cl_2F_4$ within the device cavity. The gas may be chosen to be at least one of substantially thermally insulating and substantially electrically insulating. The insulating environment may also be vacuum or partial vacuum. In order to maintain the environment around the electrostatic MEMS switch, the seal needs to be hermetic.

The systems and methods described here form a hermetic seal between a device wafer and a cap or lid wafer. The seal construction may include an indium layer deposited over a gold layer. The gold and indium layers may be deposited by ion beam sputter deposition, by plating, or sputtering using a shadow mask to define the regions in which the gold and indium layers are to be deposited, for example. The gold and indium layers are then heated to a temperature beyond the melting point of the indium (156° C.). At this point, the indium melts into the gold and forms an alloy $AuIn_x$. The alloy $AuIn_x$ may have the stoichiometry $AuIn_2$, or it may be a eutectic alloy. The alloy may be impermeable to electrically insulating gases, or high dielectric permeability gases such as $SF_6$, and therefore may form a hermetic seal to contain such gases. Because indium melts at relatively low temperatures, the hermetic seal is formed at temperatures of only on the order of 150 degrees centigrade. The formation of the seal is therefore compatible with the presence of relatively vulnerable films, such as metal films, which would melt or volatilize at temperatures of several hundred degrees centigrade. The seal formation process also allows stacks of films of various materials (metals, dielectrics, polymers) to be present in the device. Such stacks tend to delaminate and lose functionality at even slightly elevated temperatures. Nonetheless, because the alloy is stable to several hundred degrees centigrade, the seal may maintain its integrity up to these temperatures.

The metal layer may be deposited over a rigid raised feature formed on the surface of one substrate, which in turn forms a raised region in the metal layer. This raised region then penetrates the opposing layer of the other metal deposited on the other substrate, thereby ensuring a region relatively rich in composition of metal of the raised feature. For example, if the raised feature is deposited first on the device wafer, followed by conformal deposition of a gold layer, the raised feature produces a corresponding raised feature in the deposited gold layer. When assembling the wafers, the gold protrusion penetrates into the molten layer of the lower melting point metal, here the indium metal, to produce a region which is rich in concentration of the gold. Adjacent to this region will be regions which are indium-rich/gold poor. Between these two regions will occur a region having nearly the exact desired relative concentration of the metals to form the preferred stoichiometry of the alloy.

The $AuIn_x$ alloy is an example of a class of bonding mechanisms known generally as solid/liquid interdiffusion bonds (SLID). These bonds generally make use of a lower melting temperature first component which forms a bond with a higher temperature solid second component. The bond is often a metallic alloy of a low melting temperature metal such as indium and the higher temperature metal such as gold. During the processing of these materials and before sealing, it is often desirable to clean the surfaces of the structures by heating the substrates before bonding them together. However, the ability to heat the components is limited because of the low melting temperature of the first component of the SLID bond. During this heating/cleaning step, the two components of the SLID bond may react and form the alloy prematurely, interfering with their ability to form the hermetic bond later when the wafers are bonded.

Described here is a method and device for sealing a microstructure in a hermetic seal, wherein the substrates are able to be heated before bonding. This is achieved by forming a thin "keeper" layer over one of the substrates, which has an affinity for the low temperature component of the SLID bond. The keeper layer may be formed over a diffusion barrier layer, which prevents the diffusion of the keeper layer or the low melting temperature component into other deposited materials. A layer of the low temperature component is then formed over the keeper layer. Because of its affinity for the low temperature material, the low temperature material is restrained from flowing over the other areas of the substrate. Because the keeper layer is thin, it does not react with fully or exhaust the low temperature material, and the material is able to bond when placed into contact with the solid component of the SLID bond, and heated to the bonding temperature.

Accordingly, the method may include forming a device on a first substrate or a second substrate, forming a first layer of a first metal over the at least one of the first substrate and a second substrate, forming a diffusion barrier layer of a second material over the first layer, wherein the second material is immiscible in the first metal at a bonding temperature, forming a keeper layer of another metal, which may or may not be the same composition as the first metal over the diffusion barrier layer, wherein the keeper layer is substantially thinner than the first layer, and forming a layer of a second metal over the keeper layer, wherein the layer of the second metal is substantially thicker than the keeper layer. Another layer of the first material is formed on the second substrate, and the first substrate is coupled to the second substrate by heating the first and second substrates to form an alloy of the first metal and the second metal. The substrates are heated to the bonding temperature, wherein the bonding temperature is higher than the melting point of at least one of the first metal and the second metal, to form an alloy of the first metal and the second metal. The alloy encapsulates the device in a substantially hermetic seal formed by the alloy.

If the keeper layer is a material that can prevent diffusion of the second metal into the first metal on the first substrate, a separate diffusion barrier layer may not be needed. [If the diffusion barrier layer is not essential, we may want to rework this paragraph]

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

In the systems and methods described here, a MEMS device is encapsulated with a cap or lid wafer. The MEMS device may have been previously formed on, for example, a silicon-on-insulator (SOI) composite substrate, or any other suitable substrate. The sealing mechanism may be a two-metal alloy, which bonds the silicon-on-insulator composite substrate with the cap or lid wafer. The two-metal alloy may have a melting point much higher than the melting point of either of the constituent elements, so that the alloy solidifies quickly upon formation. The alloy may form a hermetic seal, preventing an enclosed gas from leaking out of the enclosed area of the MEMS device. Because the seal is a metal alloy seal, it may also provide electrical continuity between the cap or lid wafer and the device wafer.

Figure 1:
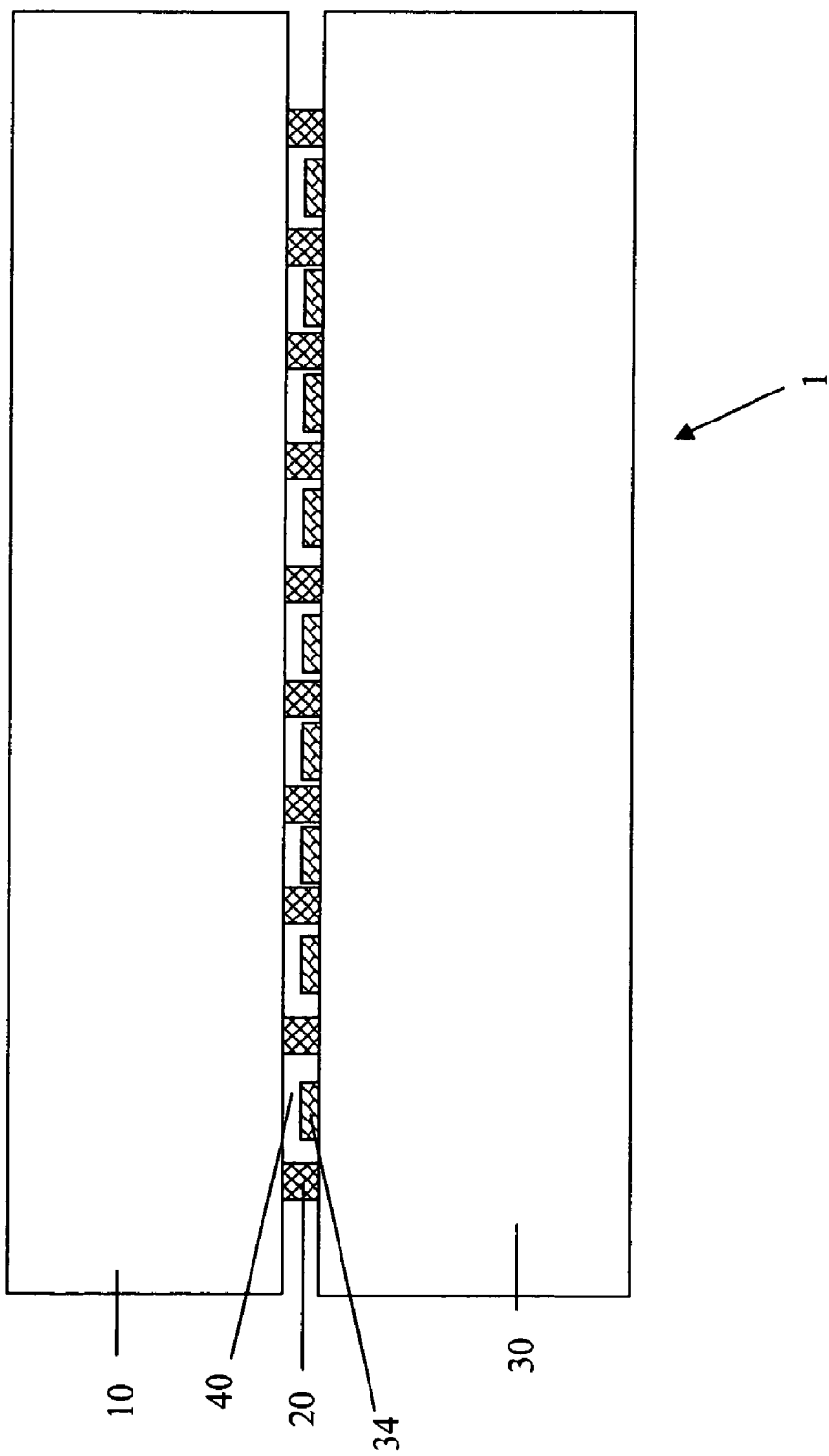
FIG. 1 is a cross sectional view of a prior art epoxy seal.
Figure 2:
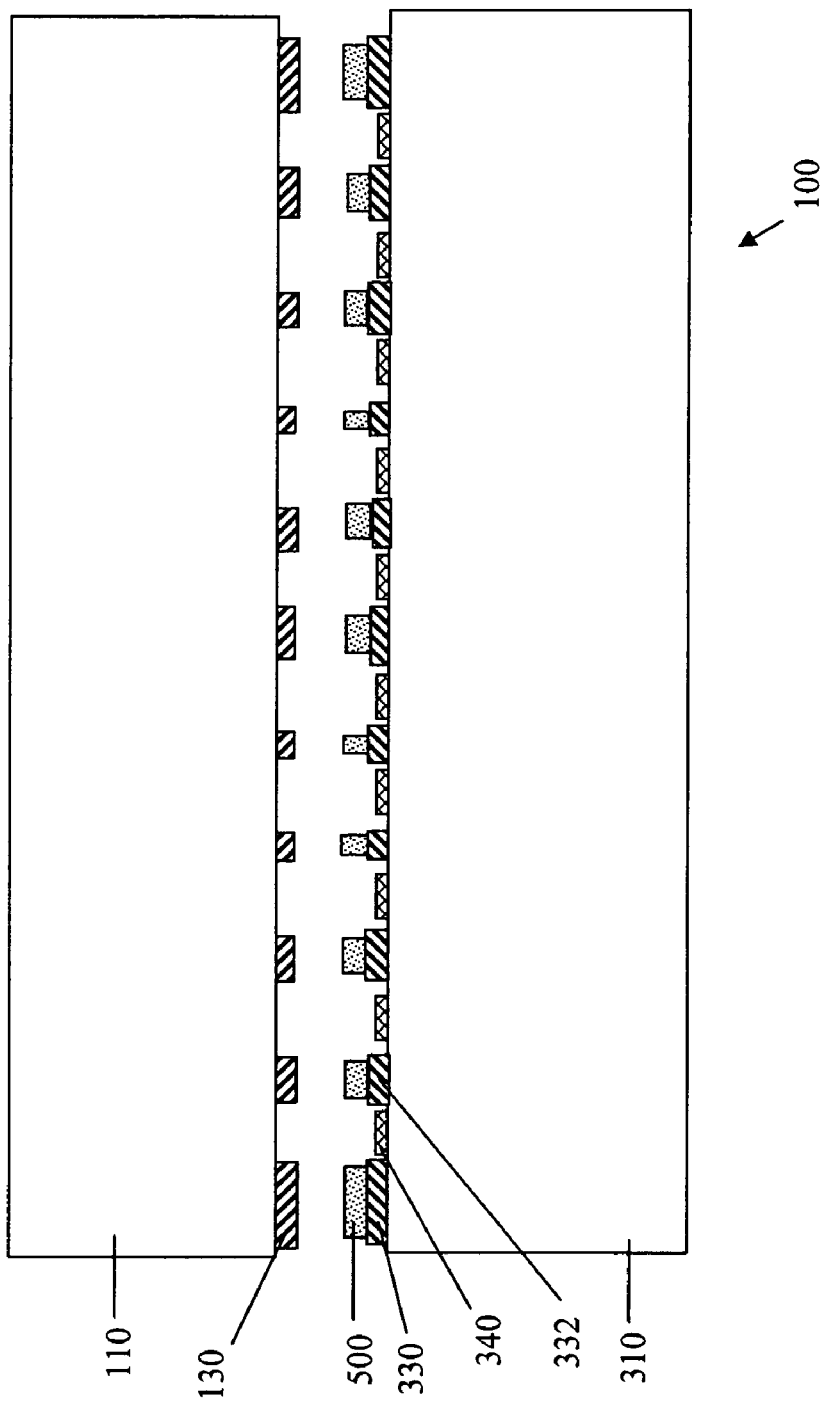
FIG. 2 is a cross sectional view showing an exemplary two-metal hermetic seal.

FIG. 2 shows a cross sectional view of an exemplary two-metal alloy sealed assembly 100 prior to formation of the hermetic seal. As shown in FIG. 2, the assembly 100 may include a first metal layer 130 deposited on a first substrate 110. The first substrate 110 may be a cap or lid wafer. Another metal layer 330 may be deposited on a second substrate 310, where metal layer 330 may be the same metal material as metal layer 130. Another metal layer 500 may be of a second metal material, and may be deposited over metal layer 330 on the second substrate 310. The second substrate 310 may be any suitable substrate, such as a silicon-on-insulator (SOI) substrate, upon which a plurality of MEMS devices 340 have been previously fabricated. Because the details of the MEMS devices are not necessary to the understanding of this invention, the MEMS devices 340 are shown only schematically in FIG. 2, as well as in the figures to follow. It should be understood that while this description pertains to the encapsulation of MEMS devices, the systems and methods disclosed here may be applied to any devices that require encapsulation. The MEMS devices 340 may be located in areas between the metal layers, such as between metal layers 330 and 332 as shown schematically in FIG. 2. The first substrate may be any suitable material, including, for example, amorphous silicon, crystalline silicon, glass, quartz, or sapphire. Metal substrates may also be used, such as Kovar, a nickel-iron-cobalt alloy or Invar, a 36/64 alloy of nickel and iron. Both metals have a coefficient of thermal expansion closely matching that of silicon, which may be advantageous in terms of minimizing stress on the bond between the second substrate 310 and the first substrate 110.

It should be understood that metal layers 130 and 330 may be multilayers, rather than a single layer of metal material. For example, layers 130 and 330 may include an additional layer of metal within layer 130 or 330, to promote adhesion of metal layer 130 or metal layer 330 to substrate 110 or 310, respectively. For example, if the layers 130 and 330 are a gold layers, they may also include a thin layer of chromium (Cr) which promotes adhesion of the gold layers 130 and 330 to the surface of the substrate 110. The chromium layer may be, for example, about 50 Angstroms to about 200 Angstroms in thickness. Furthermore, there may also be diffusion barrier layers present, to prevent the diffusion of the metal of the adhesion layer into metal layer 130 or metal layer 330. For example, the gold layers 130 and 330 may also include a thin layer of molybdenum, about 100 Angstroms in thickness, which prevents the diffusion of the chromium adhesion layer into the gold layer, which would otherwise increase the electrical resistance of the metal layer 130. The remainder of metal layer 130 may be gold, which may be, for example, 3000 Angstroms to about 5000 Angstroms in thickness.

As illustrated in FIG. 2, metal layers 130 and 330 may be made wider than metal layer 500, in order to accommodate the outflow of metal layer 500 when metal layer 500 is heated beyond its melting temperature. For example, metal layers 130 and 330 may be made about 200 μm wide, whereas metal layer 500 may be made only about 80 to about 150 μm wide. Accordingly, when metal layer 500 is melted, and placed under pressure between metal layers 130 and 330, it may flow outward from the bond region. By making metal layers 130 and 330 wider than metal layer 500, the outflow of metal layer 500 may be accommodated while still keeping metal layer 500 between metal layer 130 and metal layer 330.

The surfaces of metal layers 500 and 130 may be cleaned to prepare the surfaces for bonding, and to enhance the strength of the alloy bond. The cleaning procedures may include ion milling of the surfaces, or dipping substrate 110 with metal layer 130, and substrate 310 with metal layers 330 and 500 into a solution of hydrochloric acid (HCl) or nitric acid. The hydrochloric or nitric acid may be used for the removal of the self-passivated metal oxide surface formed over the metal layers 130, 500 and 330. Oxygen plasmas may be used to remove residual photoresist left over from the previous processing, or any other organics which may otherwise interfere with the formation of the alloy bond. The oxygen plasma treatment may be performed before the acid dip.

Figure 3:
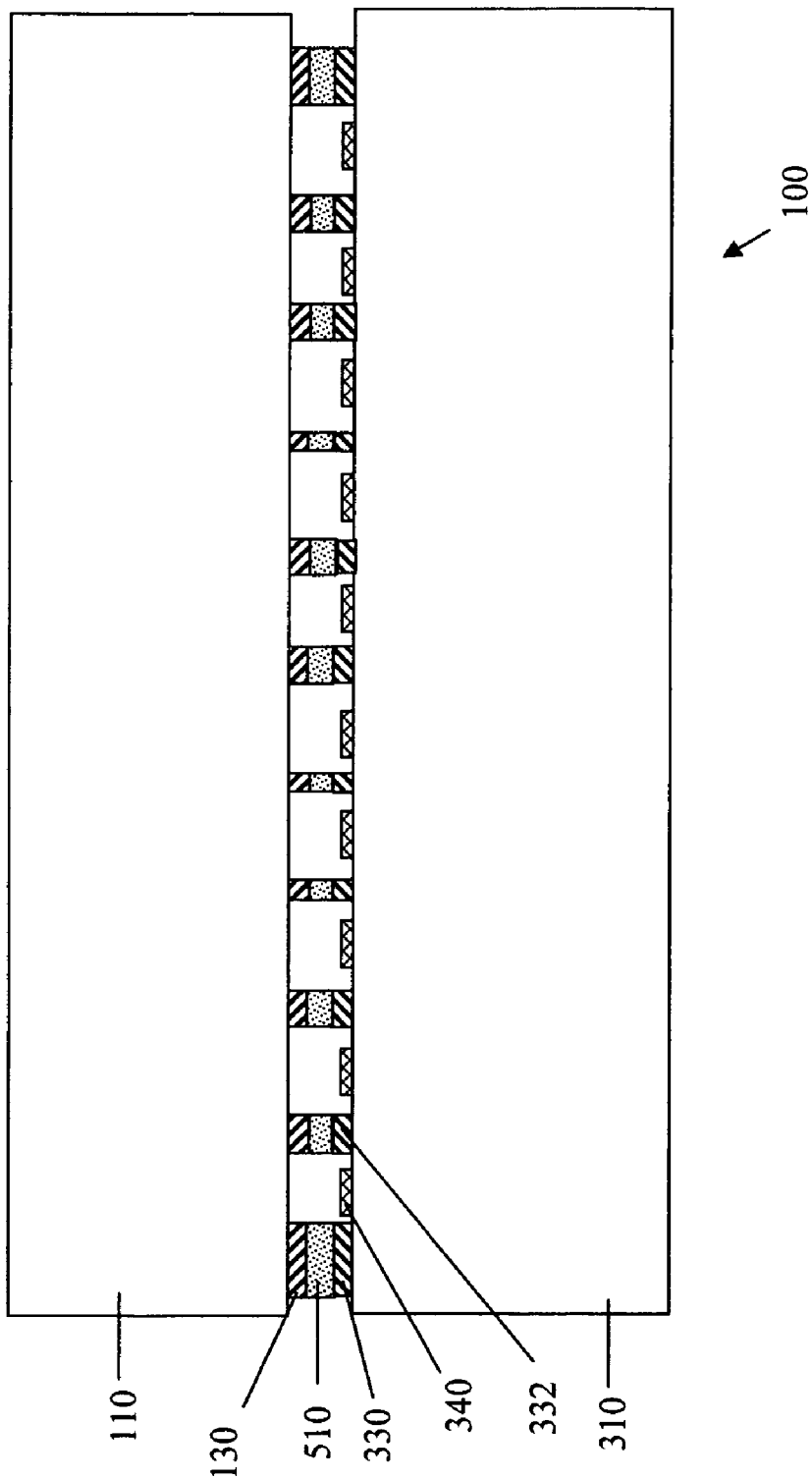
FIG. 3 is a cross sectional view showing an exemplary two-metal hermetic seal after formation of the metal alloy bond.

The material of metal layers 130, 500 and 330 may be chosen such that metal layers 130, 500 and 330 may form an alloy 510, as shown in FIG. 3. The alloy 510 may have a much higher melting point than the material of either metal layer 130, 330 or metal layer 500. The alloy 510 is formed by heating the assembly 100 beyond the melting point of the materials of either or both metal layer 130 and 330 and/or metal layer 500. Since the alloy 510 of metal layer 130 and 330 and metal layer 500 may have a melting point much higher than the original metal material of metal layer 130, 330 or metal layer 500, the alloy 510 may quickly solidify, sealing MEMS devices 340 in a hermetic seal. Exemplary environments which may be sealed in the MEMS cavity by the hermetic seal include substantially thermally or electrically insulating gases, such as $SF_6$, $CCl_2F_2$, $C_2Cl_2F_4$ and $N_2$, and vacuum and partial vacuum. By "substantially insulating," it should be understood that the gas environment has less than 50% of the electrical or thermal conductivity of 1 atmosphere of air at room temperature.

In one exemplary embodiment, the first metal layer 130 and third metal layer 330 are gold (Au) and the second metal layer 500 is indium (In). The thicknesses of the gold layers 130 and 330 to the indium metal layer 500 may be in a ratio of about one-to-one by thickness. Since gold is about four times denser than indium, this ratio ensures that there is an adequate amount of gold in layers 130 and 330 to form the gold/indium alloy $AuIn_x$, where x is about 2, while still having enough gold remaining to ensure good adhesion to the substrates 110 and 310. The gold/indium alloy $AuIn_x$ 510 may have a much higher melting point than elemental indium 500, such that upon formation of the alloy 510, it quickly solidifies, forming the hermetic bond. For example, the melting point of the gold/indium alloy may be 540 degrees centigrade, whereas the melting point of elemental indium is only 156 degrees centigrade.

Gold diffuses slowly into indium at room temperature and will diffuse fully into the indium at a temperature well below the melting temperature making the alloy $AuIn_x$ which will not melt below 400 degrees centigrade. Care may therefore be taken to process and store the assembly at low temperatures to prevent the bond from forming before intended. The device and method described below with respect to FIGS. 12-19 may address this issue, allowing the components to be heated beyond the melting temperature of the indium for a substantial period of time before bonding.

Upon heating the assembly 100 to the process temperature exceeding the melting point of indium (156 degrees centigrade), the indium becomes molten. Substrate 110 may then be pressed against substrate 310 in order to encourage the mixing of the molten indium 500 with the gold layers 130 and 330. In order to avoid squeezing all the molten indium out from the bond region by the pressing force, a standoff may define a minimum separation between substrate 110 and substrate 310.

Figure 4:
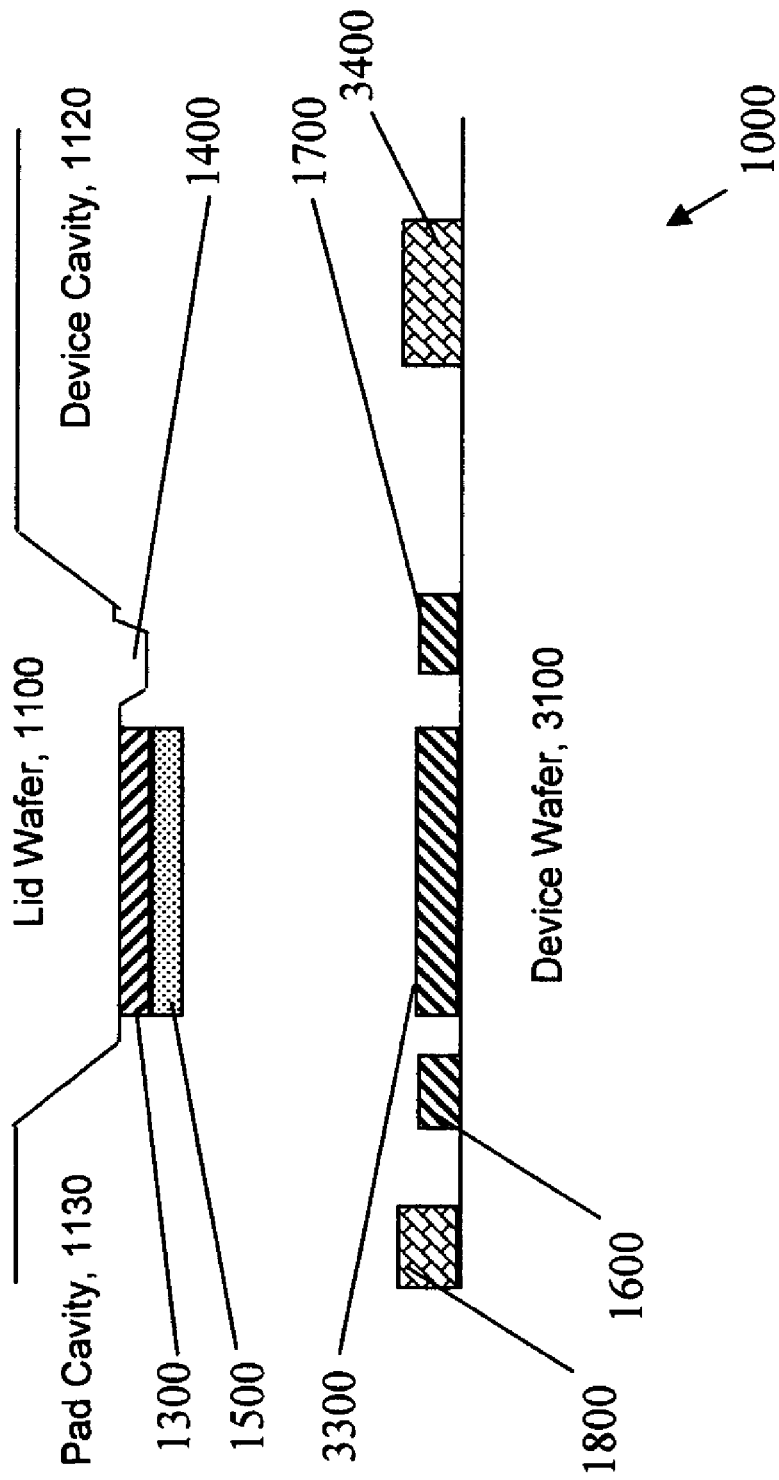
FIG. 4 is a cross sectional view showing a first embodiment of the wafer bond using two metal layers and a standoff on the lid wafer.

FIG. 4 is a cross sectional diagram of a more detailed view of the bond region 1000 of one of the devices similar to that shown in FIG. 2, according to one exemplary embodiment which includes a standoff 1400. The standoff 1400 may be formed in the lid wafer prior to depositing the metal films. The standoff 1400 may be formed by depositing and patterning photoresist over the area corresponding to the standoff, and etching the remaining surface of the lid wafer to a depth of about 2 to about 3 µm. After stripping and re-depositing the photoresist to cover the entire bonding region, the deeper cavities may be etched. These deeper cavities may include the device cavity 1120 and the pad cavity 1130. The device cavity 1120 provides clearance for the MEMS device 3400 to move, whereas the pad cavity 1130 provides clearance for external bonding pads such as pad 1800. Although not shown in this simplified view, the external pad 1800 may provide electrical access to the MEMS device 3400. The pad cavity 1130 over the pad 1800 may provide clearance for later sawing of the lid wafer to expose the bond pad 1800, which allows probing of the device 3400 before it is separated from the device wafer 3100.

After formation of the standoff 1400, the lid wafer 1100 may be plated with the bonding agents, a first layer of a first metal and a second layer of a second metal. In one exemplary embodiment, the lid wafer 1100 is plated with about 2.5 µm of gold 1300, followed by about 4 to about 5 µm of indium 1500. In addition, the device wafer 3100 may be plated with a third layer of the first metal. In this exemplary embodiment, the device wafer 3100 is plated with about 6 µm of gold 3300. It should be understood that the thicknesses disclosed above are exemplary only, and that other thicknesses may be chosen depending on the requirements of the application, as long as the thicknesses are appropriate for the formation of the metal alloy 200. Two additional gold features 1600 and 1700 may be formed at the same time as gold layer 3300. These additional gold features 1600 and 1700 may provide a dam on either side of the bond region, to confine the molten indium and prevent it from either flowing into and interfering with MEMS device 3400 or with external pad 1800. The assembly 1000 may then be heated to about 180 degrees centigrade, in order to melt the indium layer 1500 and form the gold/indium alloy 510. To assist in the formation of the gold/indium alloy 510, the lid wafer 1100 and the device wafer 3100 may be pressed together at a pressure of about 1 atmosphere. The alloy 510 may immediately solidify, forming the hermetic seal around the MEMS device. The assembly 1000 may then be cooled to room temperature.

Figure 5:
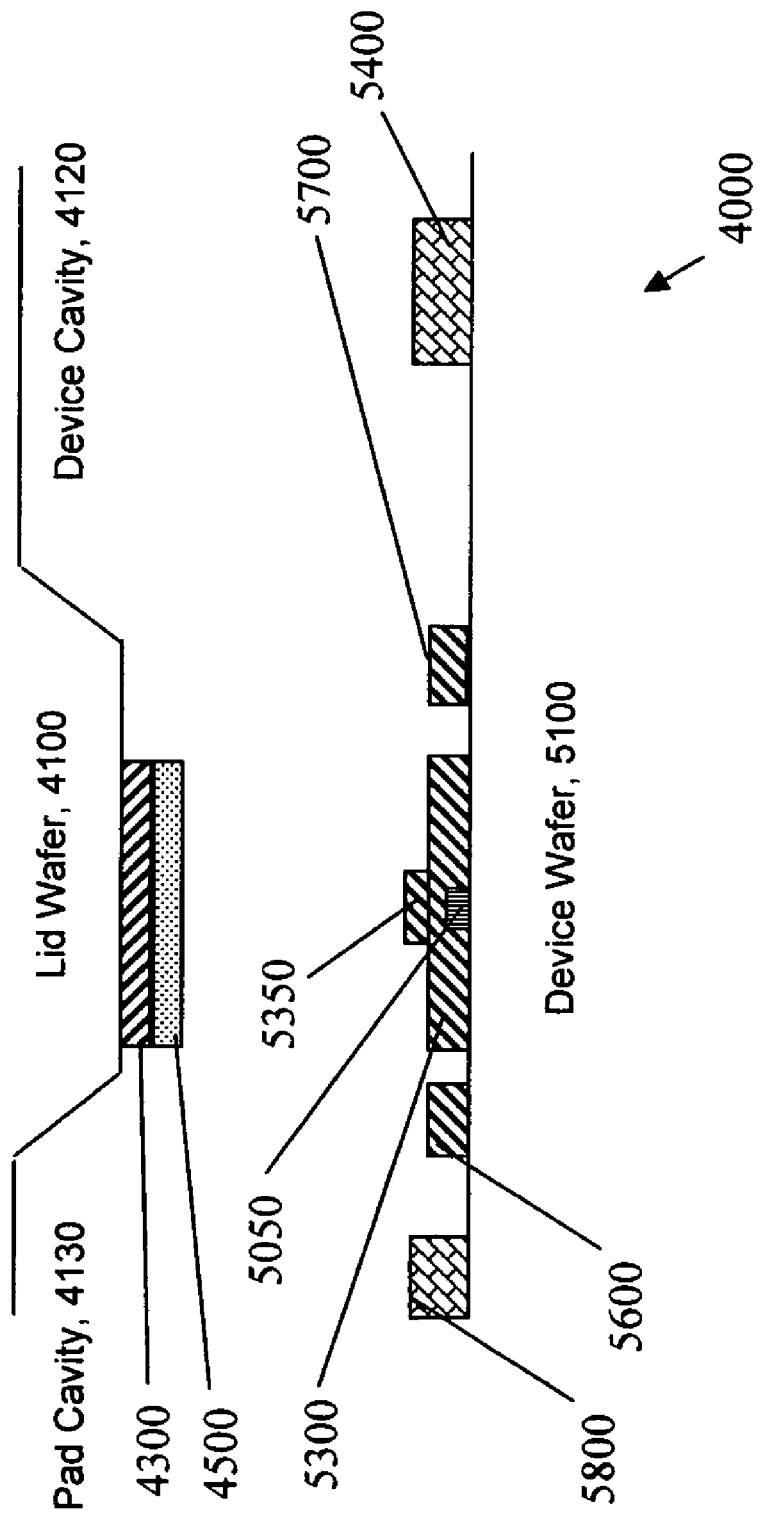
FIG. 5 is a cross sectional view showing a first embodiment of the wafer bond using two metal layers with a raised feature within the bondline on the device wafer.

FIG. 5 shows an exemplary embodiment 4000 which does not use the standoff 1400. Instead, in the embodiment 4000 shown in FIG. 5, a raised feature 5050 is deposited on the device wafer 5100, before deposition of the gold layer 5300. As used herein, the term "raised feature" refers to a feature which protrudes beyond the mating surfaces of the device, establishes a minimum separation between the surfaces of the device wafer 5100 and the lid wafer 4100, and over which at least one bonding agent may be deposited. The presence of raised feature 5050 produces a corresponding raised feature 5350 of the bonding agent, which here is a gold layer 5300, deposited conformally over the surface of the device wafer 5100 and the raised feature 5050. The resulting raised feature 5350 of the gold layer 5300 may enhance the formation of the alloy bond between the two substrates, the device wafer 5100 and the lid wafer 4100, as described further below. A second layer of a second metal, here an indium layer 4500, may be deposited over a third layer of the first metal, here a gold layer 4300. The second layer 4500 and third layer 4300 may be deposited on the second substrate, which here may be the lid wafer 4100.

Figure 6:
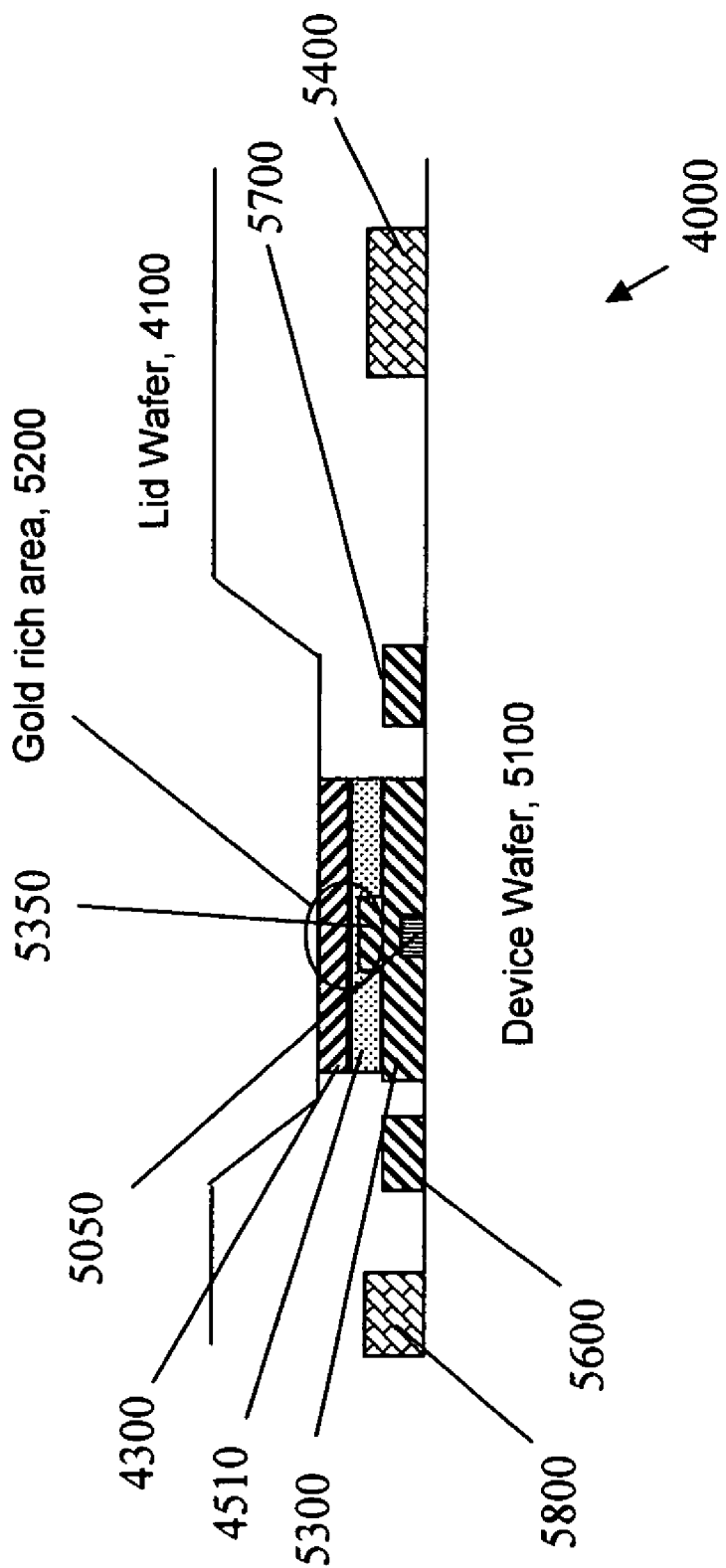
FIG. 6 is a cross sectional view showing a first embodiment of the wafer bond of FIG. 5 after the device wafer and lid wafer are brought together.

As the device wafer 5100 is brought toward the lid wafer 4100 during processing, the raised feature 5350 of the gold layer 5300 penetrates the molten indium layer 4500, until it touches or nearly touches the opposing gold layer 4300. FIG. 6 shows the embodiment of FIG. 5 after the device wafer 5100 and the lid wafer 4100 are brought together, with the raised feature 5350 of the gold layer 5300 penetrating the indium layer 4500. Since the indium layer 4500 is molten, it is free to flow out of the bondline region until the mating surfaces of the device wafer 5100 and the lid wafer 4100 reach the minimum separation defined by the raised feature 5350 in the gold layer 5300. Therefore, the raised feature 5350 may serve the same function as the standoff 1400 in the embodiment shown in FIG. 4.

Since most of the molten indium 4500 may have been squeezed out of the region between the raised gold feature 5350 and the gold layer 4300, this region may form a gold-rich area 5200 for formation of the gold/indium alloy which is likely to have a stoichiometry $AuIn_x$ wherein x is less than 2. In other regions further from the raised gold feature 5350 and gold-rich area 5200, the stoichiometry of the gold/indium alloy may be relatively indium-rich and gold poor, and may be likely to form an alloy $AuIn_x$ wherein x is greater than two. Between these two regions, there is likely to be a region of near-perfect stoichiometry, that is, where the stoichiometry of the alloy is nearly $AuIn_2$, which may be the desired alloy. In this region, the alloy 4510 may form a hermetic seal, sealing the device 5400 from the ambient environment. Therefore, by forming the raised feature 5050 below the metal layer, at least one region of the proper stoichiometry is more likely to form, and thus create the desired hermetic seal.

The profile described above, with a gold-rich region and a gold-poor region, may be symmetric about the centerline of raised features 5050 and 5350, resulting in at least two regions of the proper stoichiometry each adjacent to the gold-rich region 5200, and therefore forming a double seal about the centerline in the example.

The raised feature 5050 may be made of any material which has suitable mechanical competency, that is, a material which maintains its rigidity at a process temperature of about 200 degrees centigrade, and does not otherwise react with the gold or indium. For example, the raised feature 5050 may be formed of a metal such as an earlier plated gold layer, a deposited or plated nickel (Ni) layer, a chromium (Cr), tungsten (W), or titanium (Ti) layer, an inorganic dielectric layer such as silicon dioxide, silicon nitride, poly silicon, amorphous silicon, spin-on glass (SOG), or a spin coated, temperature tolerant polymer layer such as SU8, polyimide, or benzocyclobutene (BCB). In one embodiment, copper (Cu) is deposited by electroplating to a thickness of about 3 µm to about 6 µm. Copper is chosen in this embodiment for convenience, and may be deposited simultaneously with other copper features such as sacrificial layers located beneath the movable MEMS device 5400. In general, the thickness (or height) of the raised feature 5050 may be on the order of the thickness of the second metal layer, here the indium layer 4500, so as to penetrate through or nearly through the second metal layer. In general, the height of the raised feature may be between about 3 µm and about 6 µm tall. For example, the thickness (or height) of the raised feature 5050 may be about 4.8 µm and the thickness of the indium layer about 5.3 µm. The width of the raised feature may be between about onequarter and about one-half of the width of the metal layers 4300, 4500 and 5300, which form the bondline. In one exemplary embodiment, the width of the raised feature is about 20 µm to about 40 µm, and the width of layer 4500 of the bondline is about 80 to about 150 µm before melting, and the width of metal layers 4300 and 5300 are about 200 µm. The thickness of the first layer of the first metal, here gold layer 5300, may be about 6 µm. The thickness of the second layer of the second metal, here indium 4500, may be about 4 to about 6 µm, and the thickness of the third layer of the first metal, here gold layer 4300, may be about 2.5 µm. The total thickness of the resulting alloy 4510 may be about 4 µm to about 6 µm thick.

The embodiment shown in FIG. 5 may have the advantage that no standoff 1400 needs to be formed on the lid wafer, which eliminates the process steps described above for the formation of this feature. In addition, comparison of FIG. 4 with FIG. 5 reveals that the elimination of the standoff 1400 may also reduce the area on the wafer that must be dedicated to the bonding operation. Also, by assuring the proper stoichiometry of the AuIn$_x$ alloy in at least one two regions, an effective hermetic seal may be formed. In fact, testing of devices made according to the embodiment illustrated in FIG. 5, compared to the embodiment shown in FIG. 4, an improvement in die yield hermeticity from about 80% to about 95% was realized. This improved hermetic seal may be much more resistant to temperature cycling compared to the seal made by the embodiment illustrated in FIG. 4, because the bondline is inherently soft and ductile, and a double seal is formed about the raised feature 5350 centerline. Section photos of the design made according to the embodiment shown in FIG. 6 show cracks that appear to propagate along the length of the bondline at perhaps some undesired stoichiometry. The cracks were not seen to propogate across the raised feature 5350. Since the height of the raised feature 5050 is controlled by sputtering, electroplating, lithographic or other uniform deposition method, the minimum separation between the substrates 4100 and 5100 may be controlled very tightly. Because the height of the raised feature 5050 and 5350 (4.8 µm) is nearly the same as the thickness of the indium layer (5.3 µm), the raised feature may effectively divide the volume of indium, leaving a relatively small volume of residual molten indium between the raised feature 5350 and the gold film 4300, which is susceptible to squeeze-out from between the bondlines. This smaller squeeze-out volume may make the bonding operation more reliable and more repeatable.

To further confine the flow of indium, the embodiment in FIG. 5 may also have a pair of gold features 5600 and 5700 on either side of the bond line, which serve as dams to impede the flow of molten indium into the device cavity 4120 or the pad cavity 4130 areas. These features may perform a function similar to features 1600 and 1700 in the exemplary embodiment shown in FIG. 4.

Figure 7:
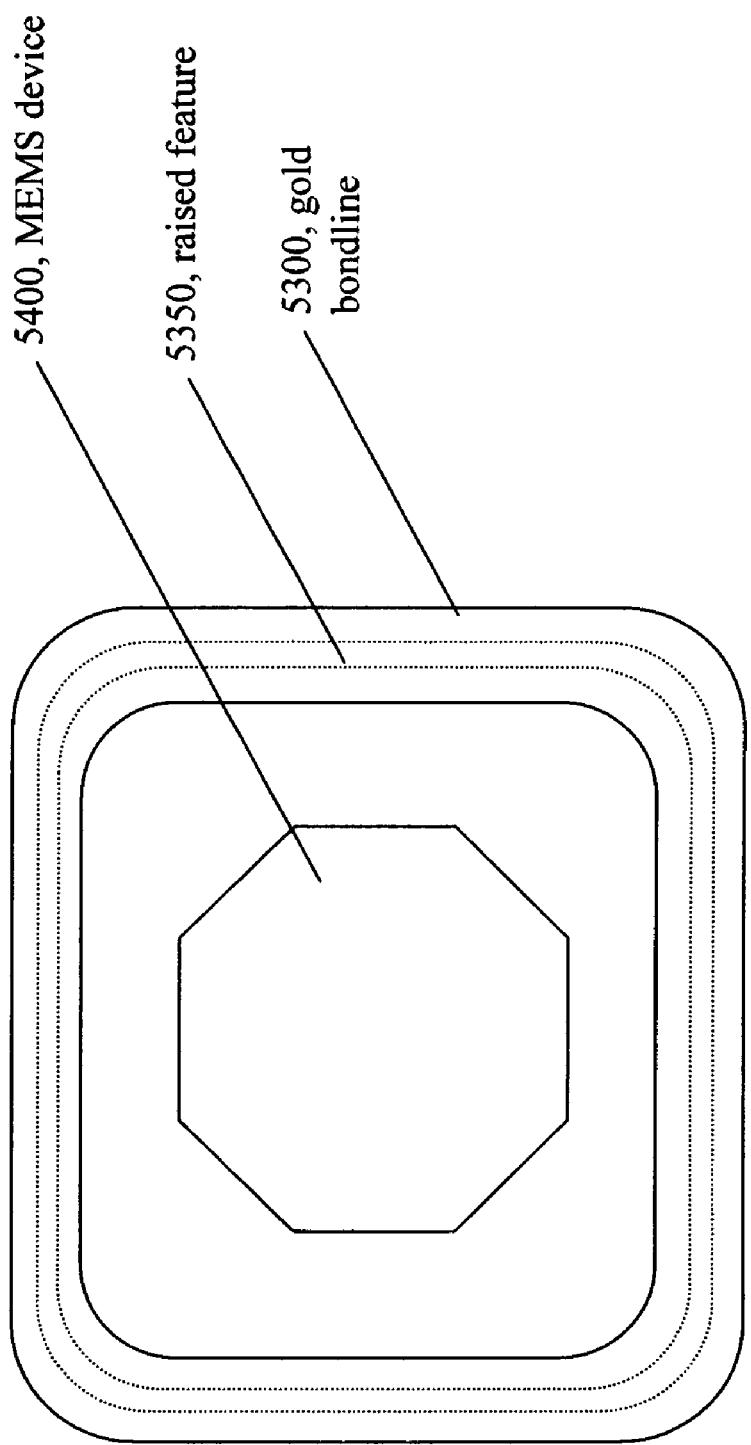
FIG. 7 is a plan view showing the first exemplary embodiment of the wafer bond using two metal layers with a raised feature on the device wafer.

FIG. 7 shows a plan view of the exemplary embodiment shown in cross section in FIG. 5. As shown in FIG. 6, the raised feature may completely circumscribe the MEMS device 5400 as a continuous perimeter. Alternatively, the raised features may only exist in certain portions around the perimeter of the device, such as in a series of raised pads or protrusions rather than a raised line. Raised pads rather than a raised line completely circumscribing the device may have the advantage that the gases are free to enter and exit the device cavity during fabrication. This may be convenient, as the pressure differential across the raised features may be allowed to equilibrate before the hermetic seal is made, and the desired gas may be allowed to completely replace the ambient gas around the MEMS device 5400 before sealing.

Figure 8:
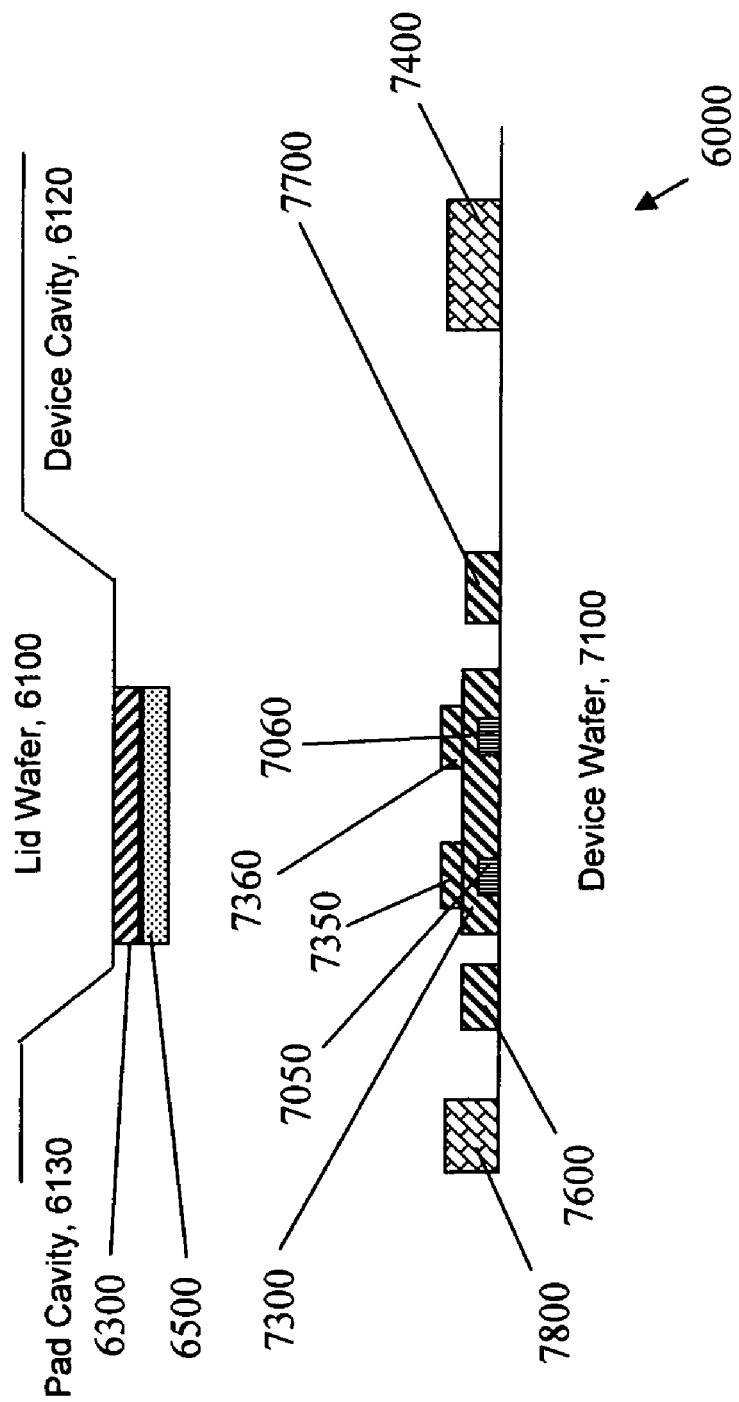
FIG. 8 is a cross sectional view showing a second embodiment of the wafer bond using two metal layers with a raised feature within the bondline on the device wafer.

FIG. 8 shows a second embodiment 6000 of the metal alloy hermetic seal using the raised features. As shown in FIG. 8, there may be more than one raised feature around the perimeter of the device, such as the two raised features 7050 and 7060. Like the first embodiment shown in FIGS. 5 and 6, the raised features 7050 and 7060 may be formed of a sacrificial material, which may be, for example, copper electroplated on the surface of the device wafer 7100. The presence of raised features 7050 ad 7060 cause two corresponding raised features, 7350 and 7360 to be formed upon deposition of the conformal gold layer 7300 over the raised features 7050 and 7060. As before, the bondline may include another electroplated gold layer, 6300, as well as an electroplated indium layer 6500. Although two raised features 7050 and 7060 are shown in FIG. 8, it should be understood that this is exemplary only, and that any number of additional raised features may be used. Also, it should be understood that the raised features may completely circumscribe the device as shown in FIG. 7, or the raised features may be distinct, and form, for example, a series of raised protrusions. Also as before, two additional gold features 7600 and 7700 may serve as dams to block the flow of molten indium into the device cavity 6120 or the pad cavity 6130. As with the previous embodiments, the raised features 7350 and 7360 may penetrate the layer of molten indium 6500, to provide at least two locations for each raised feature wherein the ratio of gold to indium is the preferred 1 to 2, to form the preferred alloy, AuIn$_2$.

Figure 10:
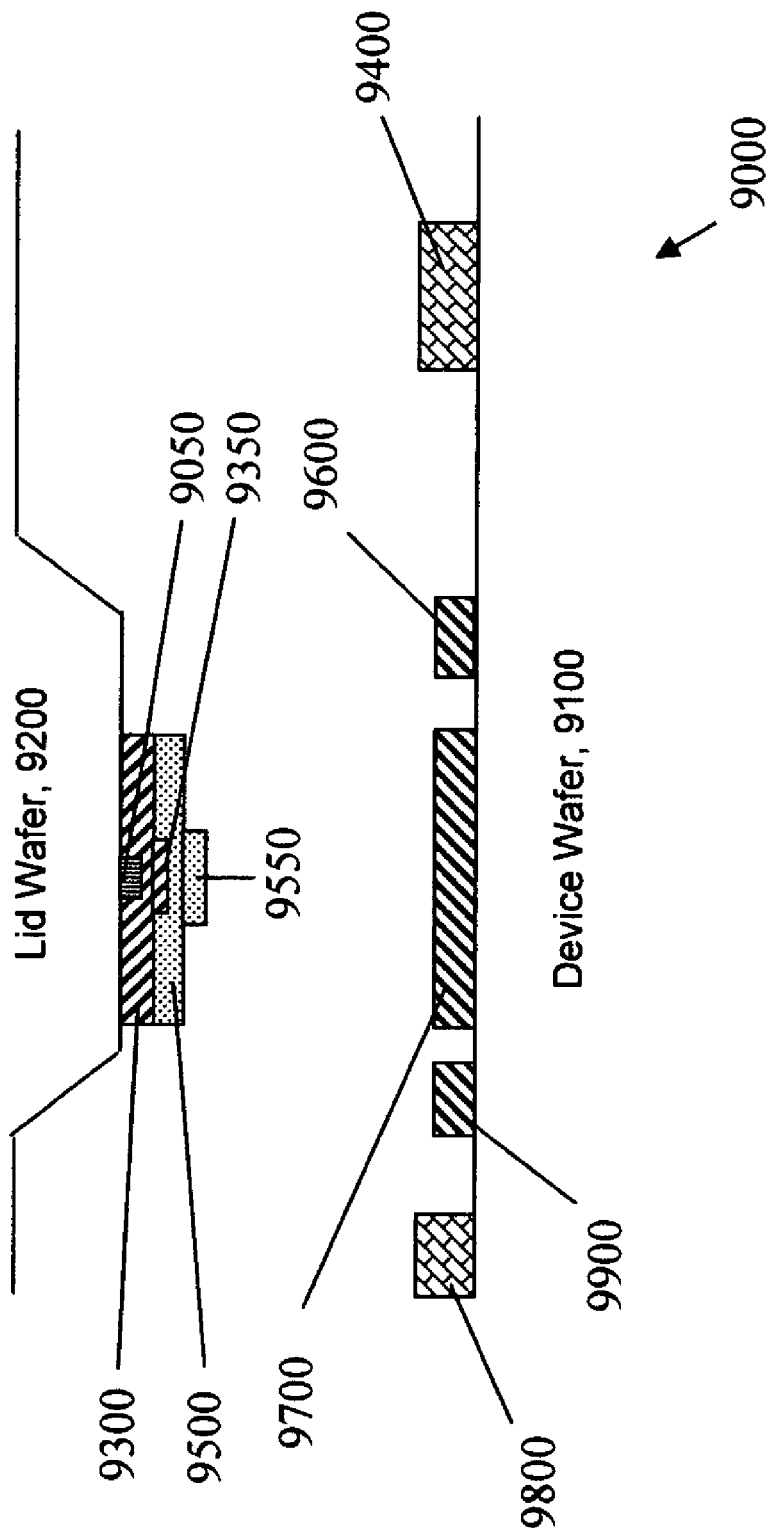
FIG. 10 is a cross sectional view showing a fourth embodiment of the wafer bond using two metal layers with a raised feature within the bondline on the lid wafer.

FIG. 10 shows a fourth embodiment 9000 of the metal alloy bond with the raised feature. In the fourth embodiment 9000, the raised feature 9050 is placed on the lid wafer 9200, rather than the device wafer 9100. In this embodiment, all the other aspects of the design, such as layer thicknesses, and widths of the raised feature may be the same as in the first embodiment illustrated in FIG. 5. In addition, there may be a plurality of raised features formed on the lid wafer 9200, rather than just the one shown in FIG. 10. The presence of the raised feature 9050 then causes a raised feature 9350 to be formed in the overlying gold layer 9300, and then a corresponding raised feature 9550 to be formed in the indium layer 9500 deposited over the gold layer 9300 and raised feature 9350 on the lid wafer 9200. When the indium layer 9500 becomes molten during processing and the device wafer 9100 is pressed against the lid wafer 9200, the raised feature 9350 of the gold layer 9300 protrudes through the molten indium 9500, until it touches or nearly touches the gold layer 9700 deposited on the device wafer 9100. Therefore, the raised gold feature 9350 performs a similar function to the raised feature 5350 in FIG. 5, that is, to put two gold-rich regions in close proximity to each other by penetrating the molted indium layer, thereby creating a spectrum of stoichiometries from gold-rich to indium-rich/gold poor. The raised feature 9050 thereby helps to ensure that there are at least two regions symmetric about each raised feature within the spectrum of stoichiometries, wherein the ratio of gold-to-indium is appropriate for forming the preferred stoichiometric alloy, AuIn$_2$. This region may form the hermetic seal around the MEMS device.

Figure 11:
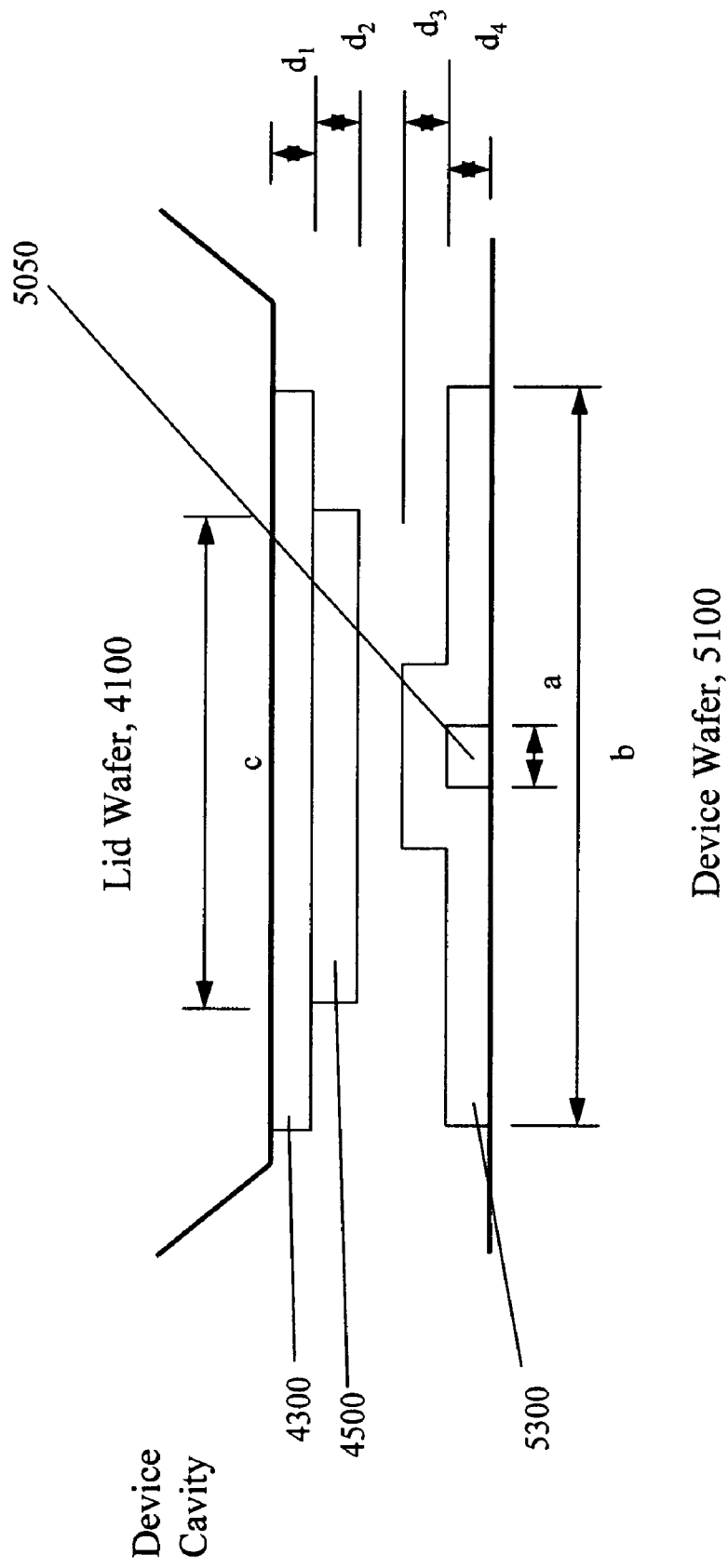
FIG. 11 is a cross sectional view showing an embodiment of the wafer bond using two metal layers with a raised feature with exemplary dimensions shown.

FIG. 11 shows an exemplary embodiment using the design guidelines set forth above, which may be used to form a hermetic bondline with high yield in a volume production setting. This embodiment is characterized by the metal layer widths a, b and c, and by the layer thicknesses $d_1$-$d_4$. The raised feature 5050 and first layer 5300 of a first metal may be formed on a device wafer 5100, whereas the second metal 4500 and another layer 4300 of the first metal may be formed on a lid wafer 4100. The raised feature 5050, which in this embodiment may be photoresist or copper, may be about 20 µm wide for dimension a. A first metal layer 5300, in this embodiment a layer of gold, may be formed with a width b of about 120 μm. The raised feature 5050 may be located at approximately the midpoint of the bondline as shown in FIG. 11. A second metal layer 4500, in this embodiment a layer of indium, may be formed with a width c of about 80 μm on a lid wafer. The second layer of the first metal 4300 on the lid wafer 4100 may have the same width, 120 μm, as the first layer 5300. The thicknesses of the various layers 4300, 4500, 5300 and 5050 may be about the same, for example, about 5 μm. Alternatively, the thicknesses of the various layers may be different, depending on the application or the stoichiometry of the desired alloy. From the symmetry of FIG. 11, is should be understood that layers 4300 and 4500 may also be formed on the device wafer, and layers 5050 and 5300 may be formed on the lid wafer.

Figure 9:
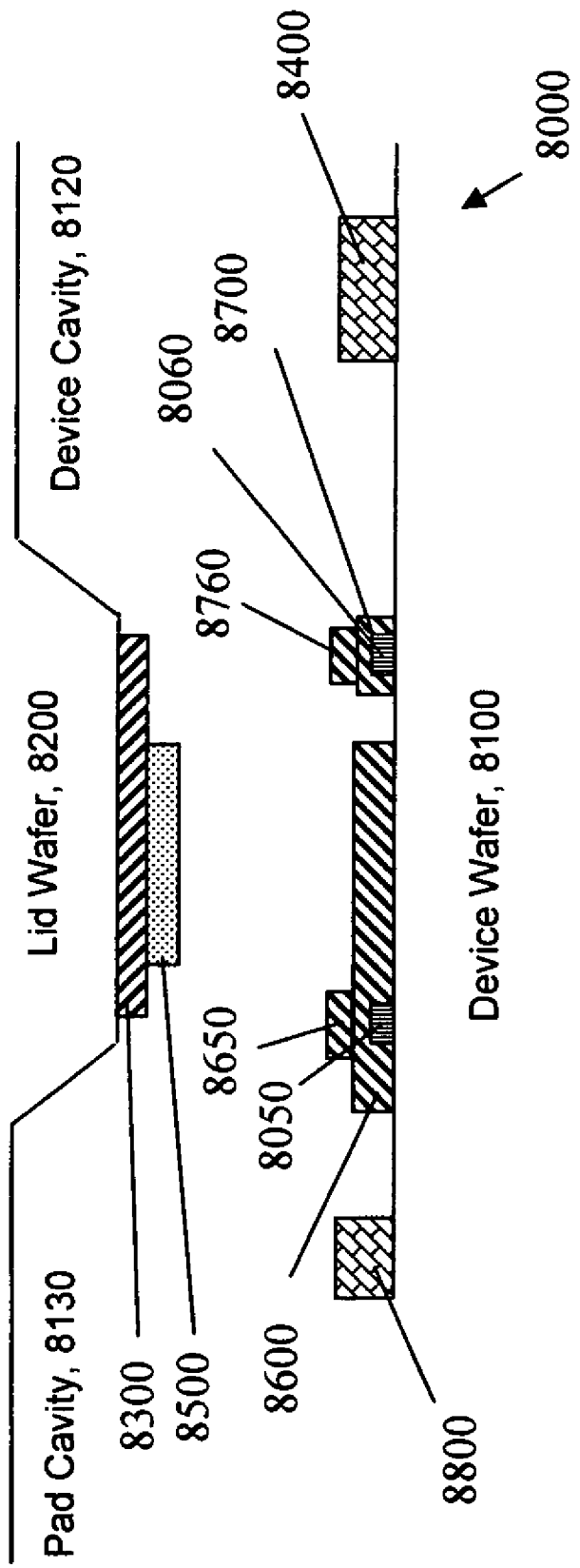
FIG. 9 is a cross sectional view showing a third exemplary embodiment of the wafer bond using two metal layers with a raised feature within the bondline on the device wafer.

As mentioned above, during heating and bonding, the liquefied indium will melt and flow over areas of the substrate if not restrained, and will alloy with the gold wherever gold is available. However, it is often desirable during processing to heat the substrate surfaces, in order to vaporize contaminants and volatile compounds which may otherwise diminish the quality of the bond or interfere with the functioning of the device. However, during this heating, it is generally desired not to activate or "spend" the bonding capabilities of the materials. If the assembly shown in FIGS. 9-11 is heated to clean the surfaces, the indium may proceed to form the alloy with the gold, so that bonding after this heating cannot take place. It is desirable, therefore, to be able to heat the surfaces to clean them before bonding, while still being able to perform the bonding after the heating/cleaning step.

The problem of restraining and maintaining the liquid component of a metal alloy bond is a generic one, occurring in many solder or alloy bonding systems, and indeed in any system having a solid component and a liquid component. These systems are known generically as solid/liquid interdiffusion (SLID) bonds. The problem exists in each of these systems of how to clean the surfaces by heating, without activating and thus spending the bonding mechanism.

The following discussion describes a method and device which allows the components of the alloy bond to be heated in the bonding chamber, driving off contaminants and impurities, which improves the cleanliness, performance and predictability of the resulting MEMS device. While the device and method are described with respect to an $AuIn_x$ alloy bond, it should be understood that the techniques may be applied to any solid/liquid interdiffusion (SLID) bond, such as Au—In—Ni system described in http://cime.epfl.ch/page31434-en.html. Other examples of a SLID bond include the copper-tin and gold-germanium systems. While the device and method is described without the raised feature 5050-9050, it should be understood that the device and method may be used with or without the raised feature, to improve the bonding effectiveness of the metal alloy or SLID bond.

It should be understood that the technique and device described below may be combined with the raised feature described above, to enhance the hermeticity, and thus the yield, of devices using these techniques. In this event, the raised feature would be formed first on one or the other substrates, and the layers described below would be formed over and around the raised feature.

The method and device may include the deposition of a diffusion barrier layer over one component, generally the solid metal component of the SLID bond, and another thin "keeper" layer over the diffusion barrier layer. The keeper layer restricts the flow of the liquid metal during heating, and the diffusion barrier layer prevents the diffusion of the materials into the underlying solid metal layer. The method may also include the deposition of other materials with other functionalities, such as an adhesion layer, however, such additional layers are not necessary to practice this invention. It should also be understood that the diffusion barrier layer may not be required, if the keeper layer is capable of restricting the lateral movement of the second metal layer, while also prohibiting its interaction with, or diffusion into, the underlying first metal. An exemplary method will be described in further detail with respect to FIGS. 12-19.

It should be understood that this method and device may be used for sealing any micromechanical device with a metal alloy bond. The device itself 340 or 3400 may have been made previously, as described above and illustrated in FIGS. 2-4. Exemplary MEMS devices with which this method may be used are further described in U.S. patent application Ser. No. 11/797,924, filed May 7, 2007 and U.S. patent application Ser. No. 11/605,312 filed Nov. 29, 2006. Each of these applications is incorporated by reference, and each is assigned to the same assignee as the present application.

Figure 12:
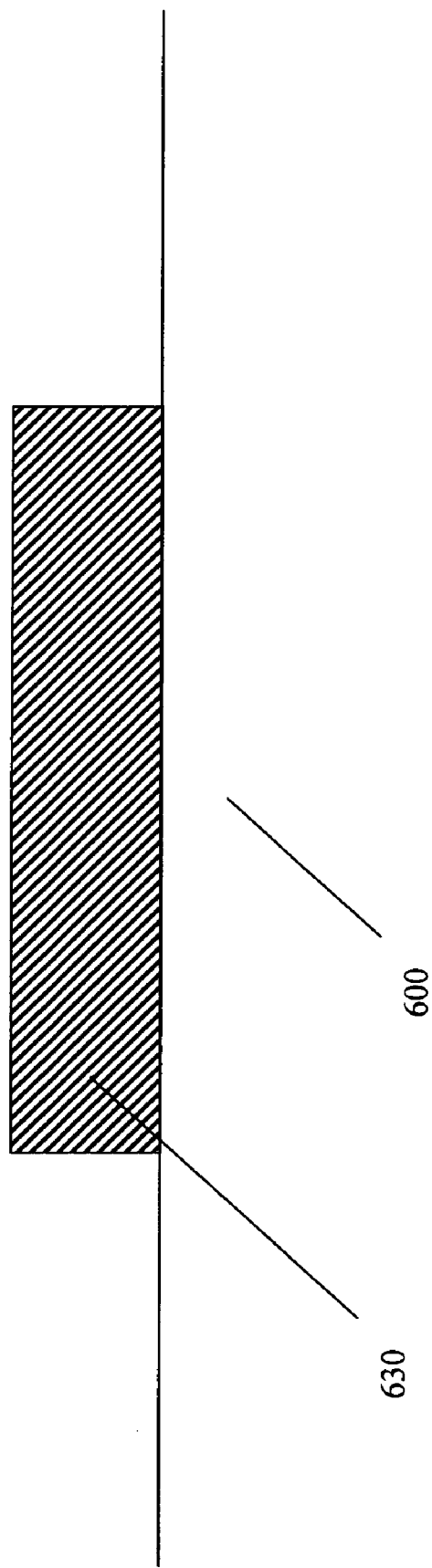
FIG. 12 is a cross sectional view showing a first step in an exemplary method of forming the wafer bond using two metal layers with keeper layer.

FIG. 12 is a cross sectional view of a first step of forming the hermetic bond using the metal alloy with a keeper layer. The process begins by depositing a first layer of a first material 630 onto a substrate surface. Preferably, the first layer of the first material 630 is deposited in substantially a continuous circumference or perimeter around the device to be enclosed. As mentioned previously, the device may be any number of MEMS or semiconductor devices that need to be enclosed in a device cavity with a hermetic seal. In the embodiment described here, the first material is gold, deposited in a layer about 1-5 μm thick and about 50-200 μm wide. The first material is one which will participate in the metal alloy bond. More generally, the first material may be the solid component of the solid-liquid interdiffusion (SLID) bond. The first material 630, as well as subsequent structures 640-670 described below, may be deposited on either of the two substrates, 600 or 7000, either of which may also support the micromechanical device.

Figure 13:
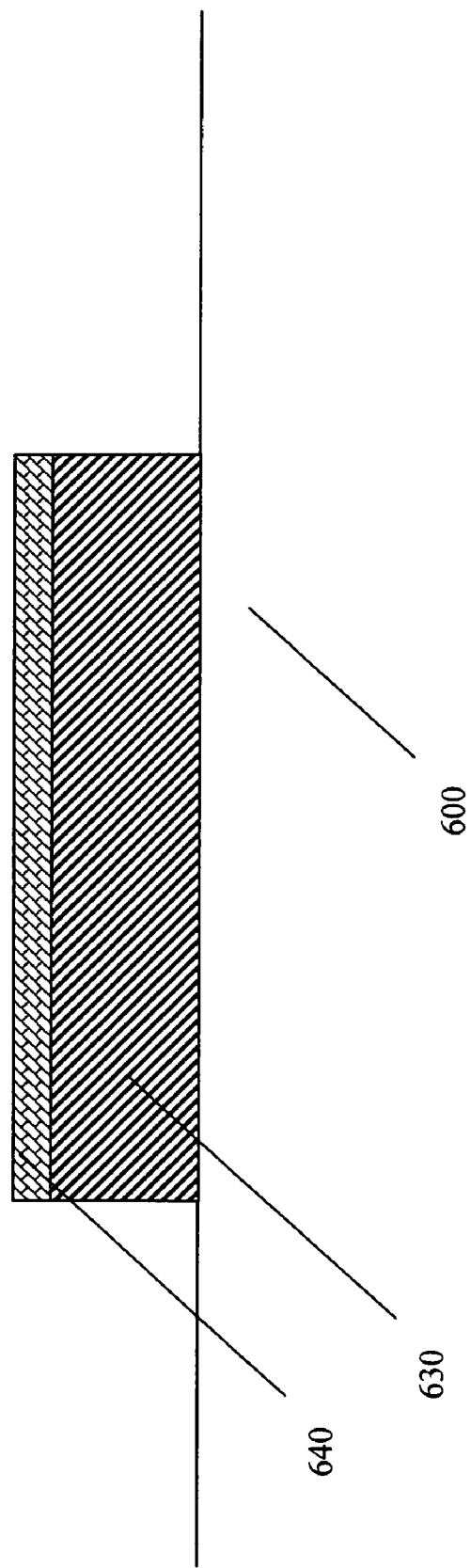
FIG. 13 is a cross sectional view showing a second step in an exemplary method of forming the wafer bond using two metal layers with keeper layer.

As shown in cross section in FIG. 13, an optional adhesion layer 640 may then be deposited adjacent, that is, on top of, the first material. The adhesion layer 640 may be, for example, titanium-tungsten, deposited to a thickness of about 20 nm.

Figure 14:
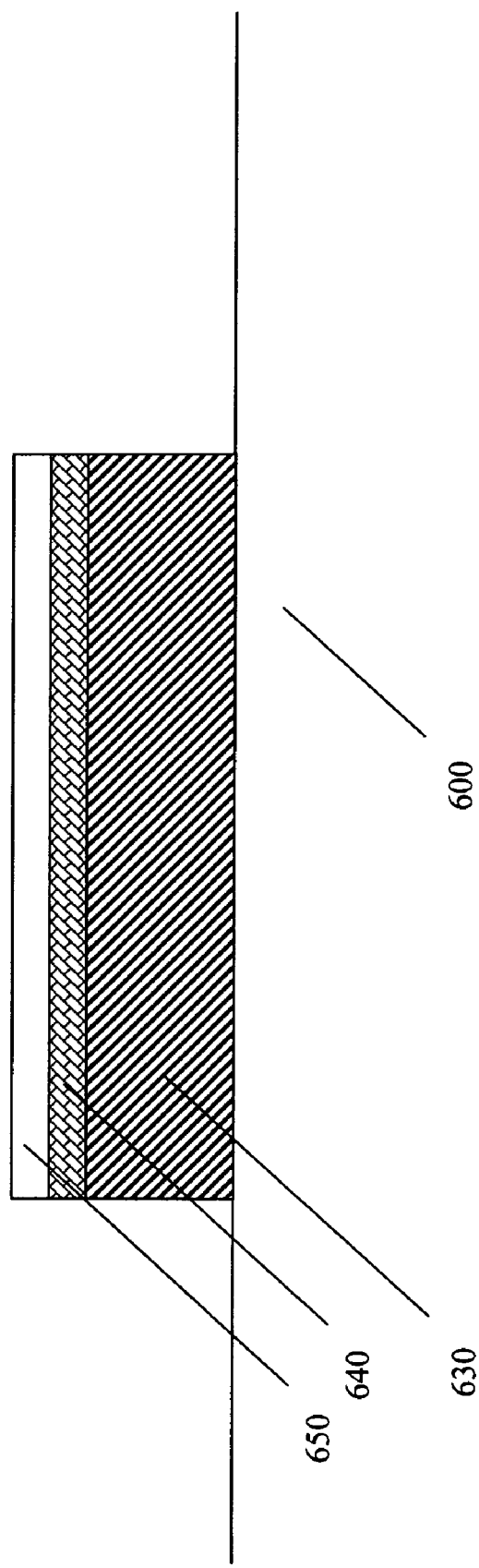
FIG. 14 is a cross sectional view showing a third step in an exemplary method of forming the wafer bond using two metal layers with keeper layer.
Figure 15:
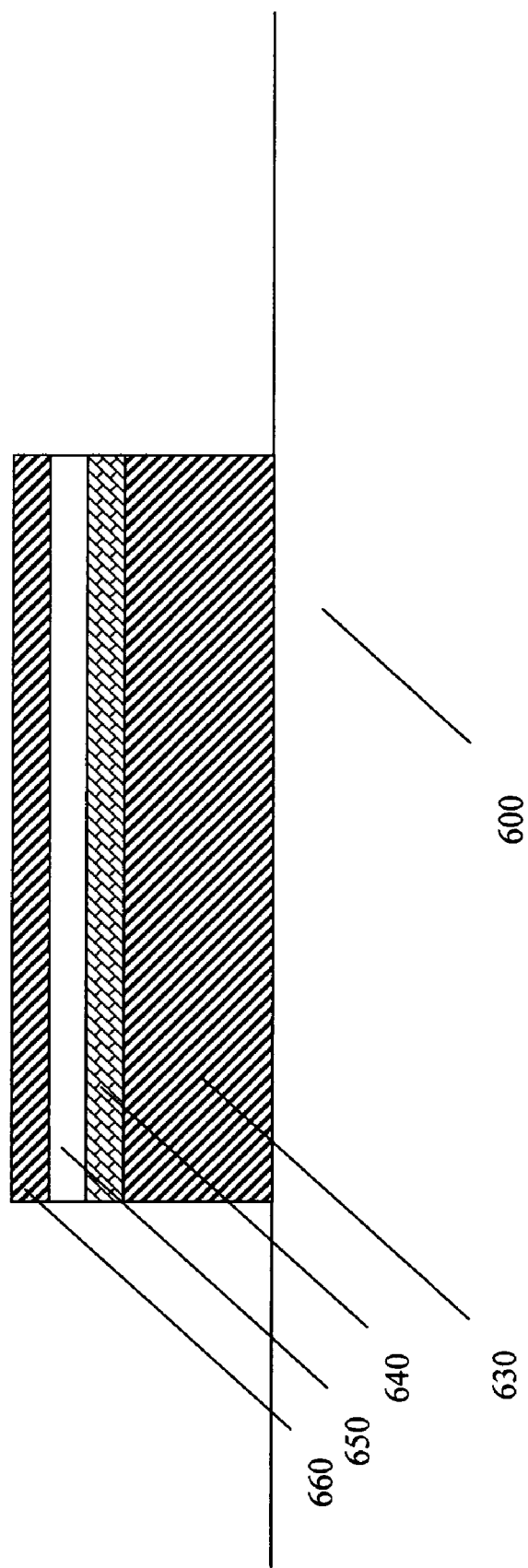
FIG. 15 is a cross sectional view showing a fourth step in an exemplary method of forming the wafer bond using two metal layers with keeper layer.
Figure 16:
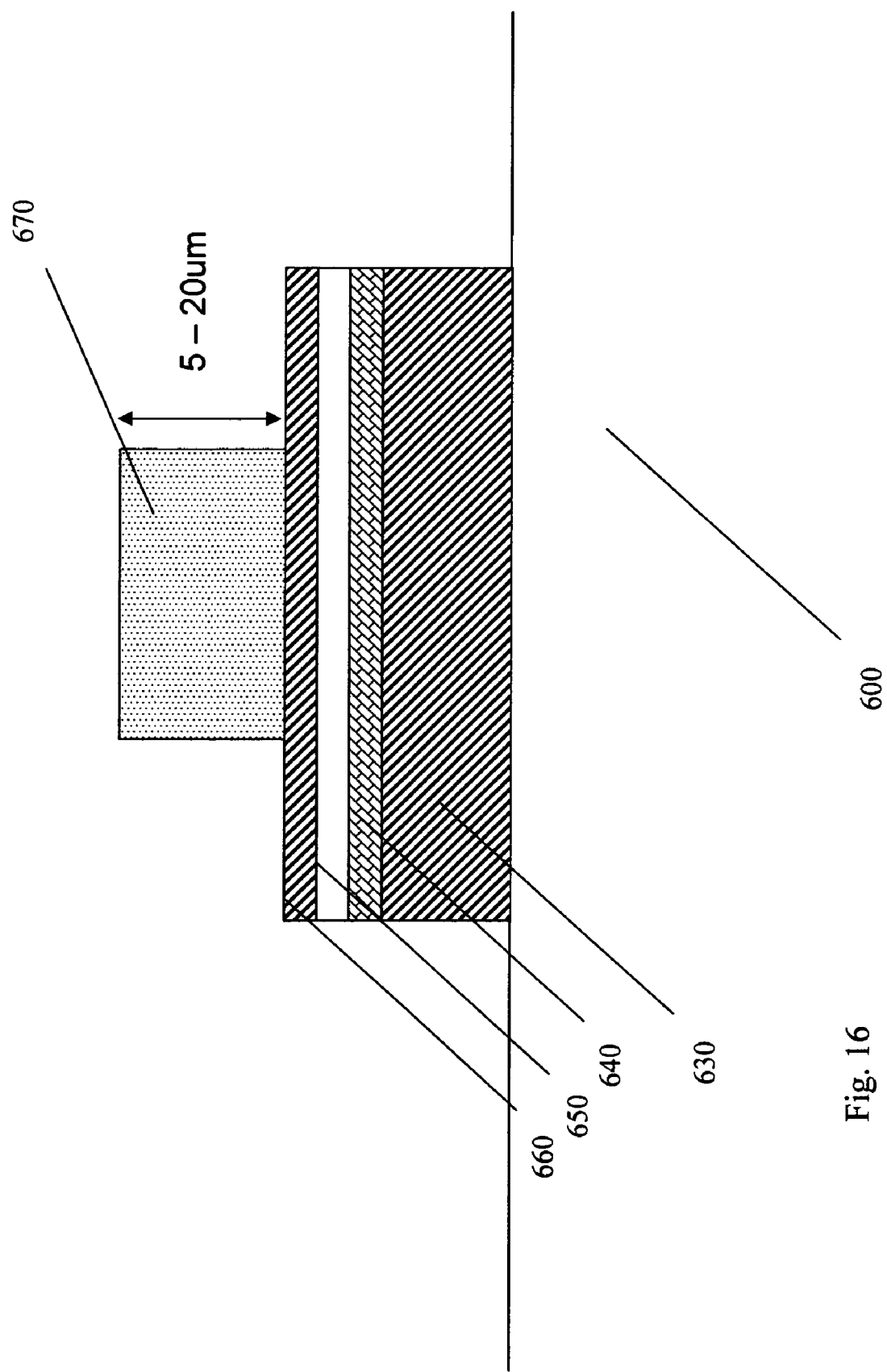
FIG. 16 is a cross sectional view showing a fifth step in an exemplary method of forming the wafer bond using two metal layers with keeper layer.

FIG. 14 shows a simplified schematic cross section of the method and device after the deposition of the diffusion barrier layer 650. In one exemplary embodiment, the diffusion barrier layer is nickel (Ni), deposited to a thickness of about 100 nm. More generally, the diffusion barrier layer may be any material which is immiscible in the first metal layer, at the bonding temperature of the SLID or metal alloy bond. The diffusion barrier layer 650 may also prohibit the migration of the materials deposited over top of it, into the first material 630.

A keeper layer 660 may then be deposited over the diffusion barrier layer 650. The keeper layer 660 may be deposited to a thickness of about 10 nm. It is important to keep this layer relatively thin, because it will form an alloy with the liquid component, which has yet to be deposited. If a thick layer of this material is used, it may consume a substantial portion of the liquid component in forming the alloy, leaving less of the liquid available for the eventual bond. Only a sufficient quantity of the material is needed to form a layer with no pinholes, voids. delamination or other problems which would diminish the integrity of the layer. Accordingly, the keeper layer is substantially thinner, at least about 10× thinner, than the first metal layer. In one embodiment, the keeper layer is less than about 0.1 μm or 100 nm thick, and more preferably, about 0.01 µm or 10 nm thick. It should be noted that the accompanying figures are not necessarily drawn to scale.

The keeper layer 660 may be comprised of any material which has an affinity for, or can form an alloy with the second metal, so as to restrict the flow of the second metal when it is heated during bonding, and which does not melt at the bonding temperature. In one exemplary embodiment, the keeper layer is the solid component (Au) of the solid/liquid interdiffusion or metal alloy bond of $AuIn_x$.

These materials may each be deposited using, for example, sputter deposition. Alternatively, any other deposition technique may be used, including evaporation, plating, CVD, PECVD, etc. Optionally, the materials 630-660 may be annealed to rid the stack of impurities, or they may be annealed after deposition of the second metal material 670, described below.

After annealing, a layer of a second material 670 may be deposited over the keeper layer. This layer may be the other component of the alloy or SLID bond. This component generally has the lower melting temperature, and will liquefy when the bond is eventually made. In this embodiment, this second material is indium (In), deposited to a thickness of about 9 µm, or more generally, within the range of about 5 µm to about 20 µm. The layer 670 of the second material may be substantially thicker than the keeper layer 660. The layer 670 may be deposited using any convenient deposition technique, such as electroplating through a stencil. Alternatively, the layer of the second material may be deposited using sputter deposition, chemical vapor deposition (CVD), or plasma-enhanced chemical vapor deposition (PECVD) for example. The deposition may result in a relatively thick layer of the material, which is relatively narrow, for example, about 50 µm wide compared to an underlying gold layer about 100 µm wide. This narrower width of the second layer 670 will allow the material to flow outward upon liquefaction without exceeding the bond line boundary defined by the underlying gold layer 630. Ideally, the second layer has a greater affinity for the keeper layer 660 than it does for the diffusion barrier layer 650. In one embodiment, this wafer stack 630-670 may be annealed in an oven for about 2 hours at 200 degrees centigrade, to rid the stack of impurities in the plated film 670.

Figure 17:
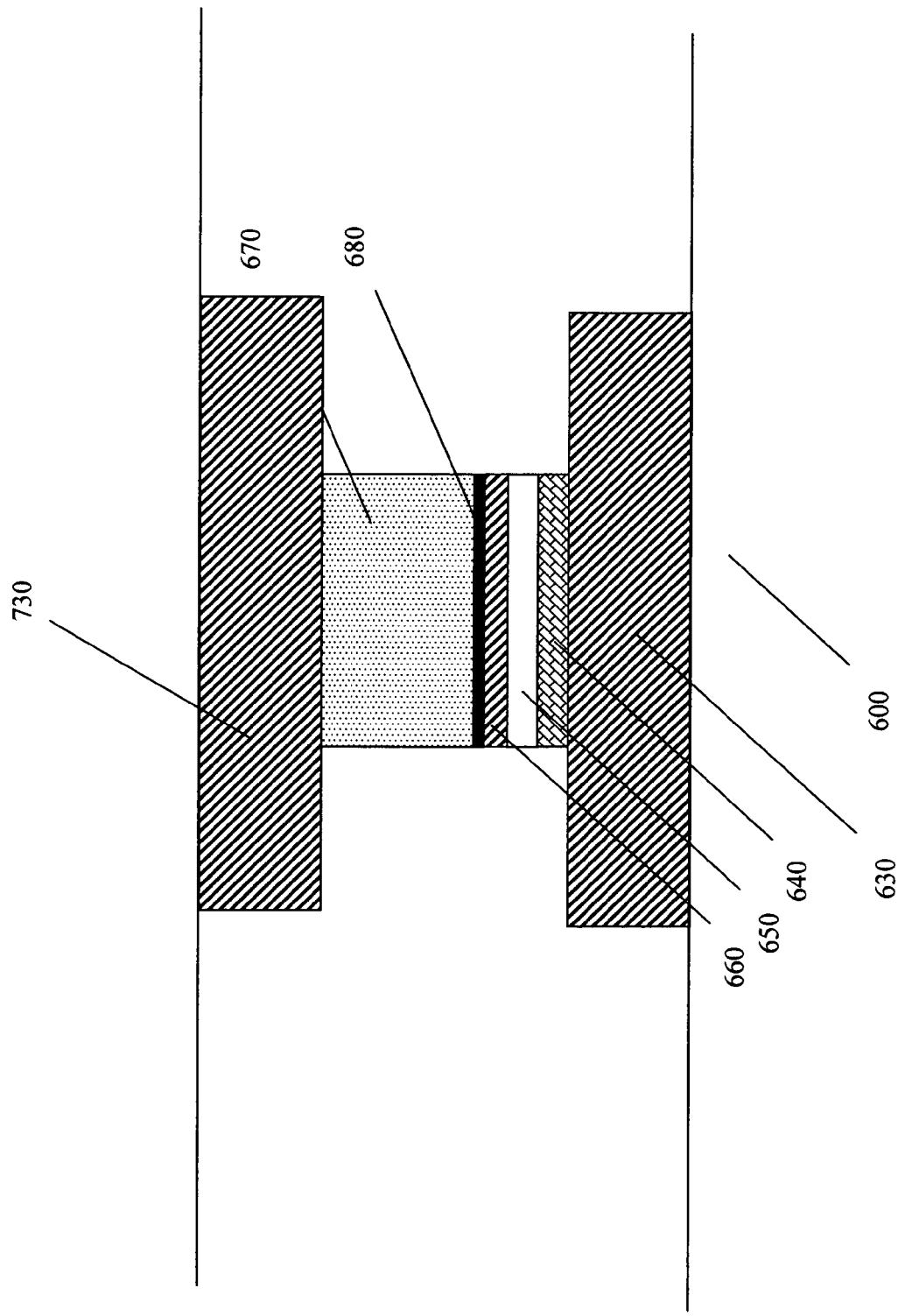
FIG. 17 is a cross sectional view showing a sixth step in an exemplary method of forming the wafer bond using two metal layers with keeper layer.

The next step is illustrated in the cross section of FIG. 17. The underlying layers of the optional adhesion layer TiW 640, the diffusion barrier layer Ni 650 and the keeper layer of Au 660, may be patterned using the layer of the second material In 670. The In layer 670 may serve as a mask to protect the underlying layers 640-660, directly beneath it while other areas of 640-660 are removed. The material 640-660 may be removed by, for example, ion milling, although other removal techniques such as wet or thy etching may also be employed. The material is removed down to the level of the layer of the first material 630. The milling process may be carefully timed, to avoid removing gold layer 630, which will remain to participate in the bonding described below.

Either before, during or after the removal of the material beyond the layer of the second material 670, the metal stack may be heated in an oven to at least about 200 degrees centigrade for at least about 1 hour. This step may remove or desorb impurities and contaminants that are found in the deposited layers. Many thin-film deposited materials are laid down with various and multiple impurities, either naturally occurring in the material itself, sloughed off from the deposition apparatus, or formed during the deposition process. As is well known in thin film processing, heating the materials making up a device can be an effective way to clean the surfaces. The heat may volatilize components, polymerize organic contaminants, or promote the reaction of the contaminants into compounds which can be removed by the vacuum system.

During this heating step, the second, lower melting temperature material will melt, and form an alloy with the keeper layer. This alloy layer is shown as 680 in FIG. 17. Formation of the alloy may consume most, if not all, of the material of the keeper layer, but will not consume most or all of the second material 670 because, as mentioned previously, the layer 670 of the second material is substantially thicker than the keeper layer 660. The remainder of this material 670 is available to form the alloy or SLID bond, as will be described next. However, because of the affinity the second material 670, In, has for the alloy 680, the second material 670 tends not to flow or migrate away from the alloy surface 680. Thus, the presence of this alloy layer serves to "keep" the layer of the second material 670 in place. The keeper layer therefore allows the substrates to be heated without destroying or spending the bonding mechanism, before bonding the components.

Figure 18:
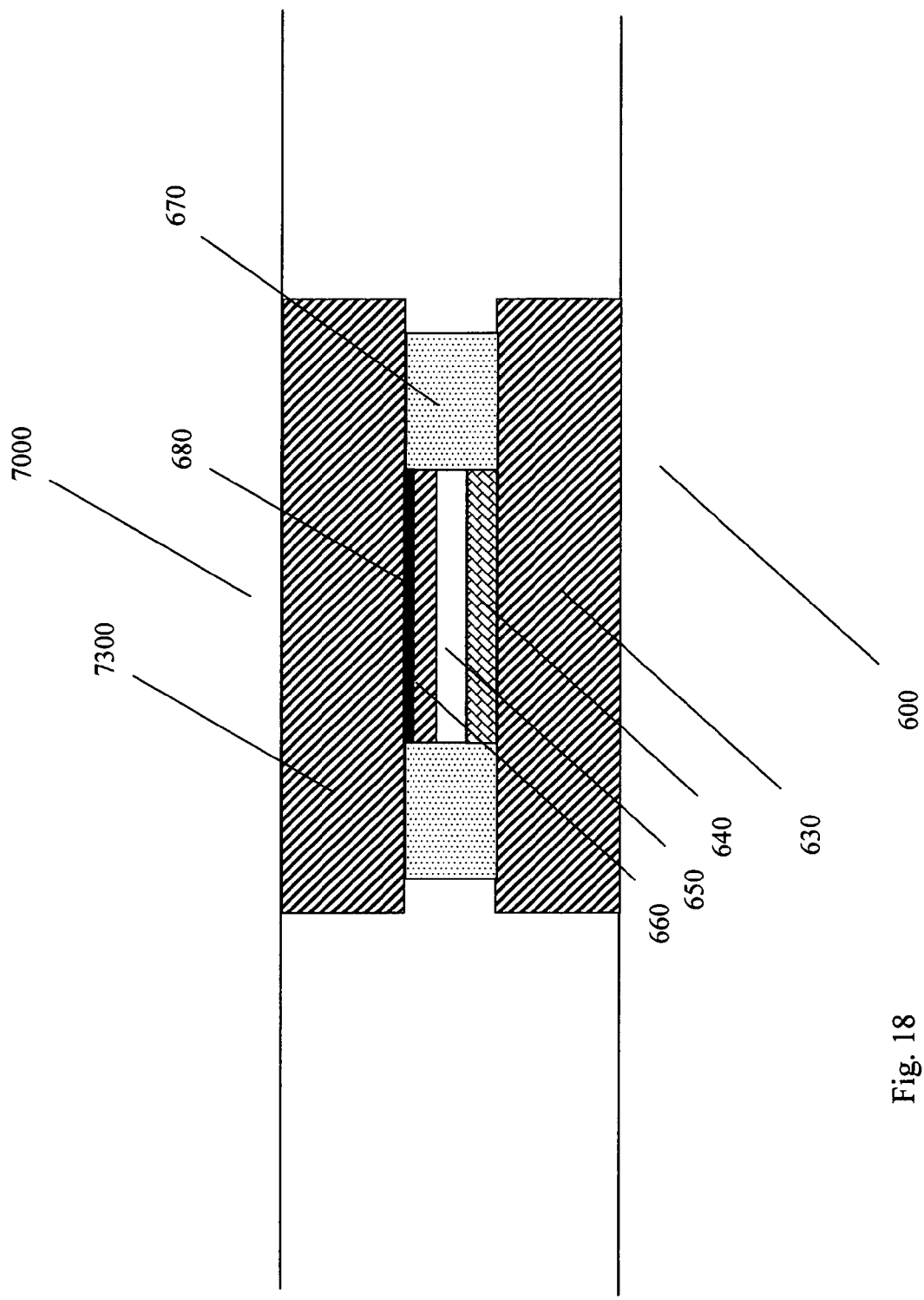
FIG. 18 is a cross sectional view showing a seventh step in an exemplary method of forming the wafer bond using two metal layers with keeper layer.

Finally, the bonding step is shown in FIG. 18. In FIG. 18, a second substrate 7000 having a second layer 7300 of the first material, here gold (Au), is brought into contact with the layer 670 of the second material, here In. The assembly is heated in a wafer bonding chamber, beyond the melting temperature of the second material 670. Pressure is applied between the wafers 600 and 7000. At this point, the second material melts and flows outward, and forms a metal alloy comprising the first and the second material. In one exemplary embodiment, the metal alloy is an $AuIn_x$ alloy, wherein x is about 2. The bonding in this system can be accomplished by heating the wafer assembly at a temperature of about 200 degrees centigrade for about 8 hours. As described previously, a preferred gas environment may be sealed in the device cavity by evacuating the wafer bonding chamber prior to bonding, and refilling the chamber with the preferred environment.

Figure 19:
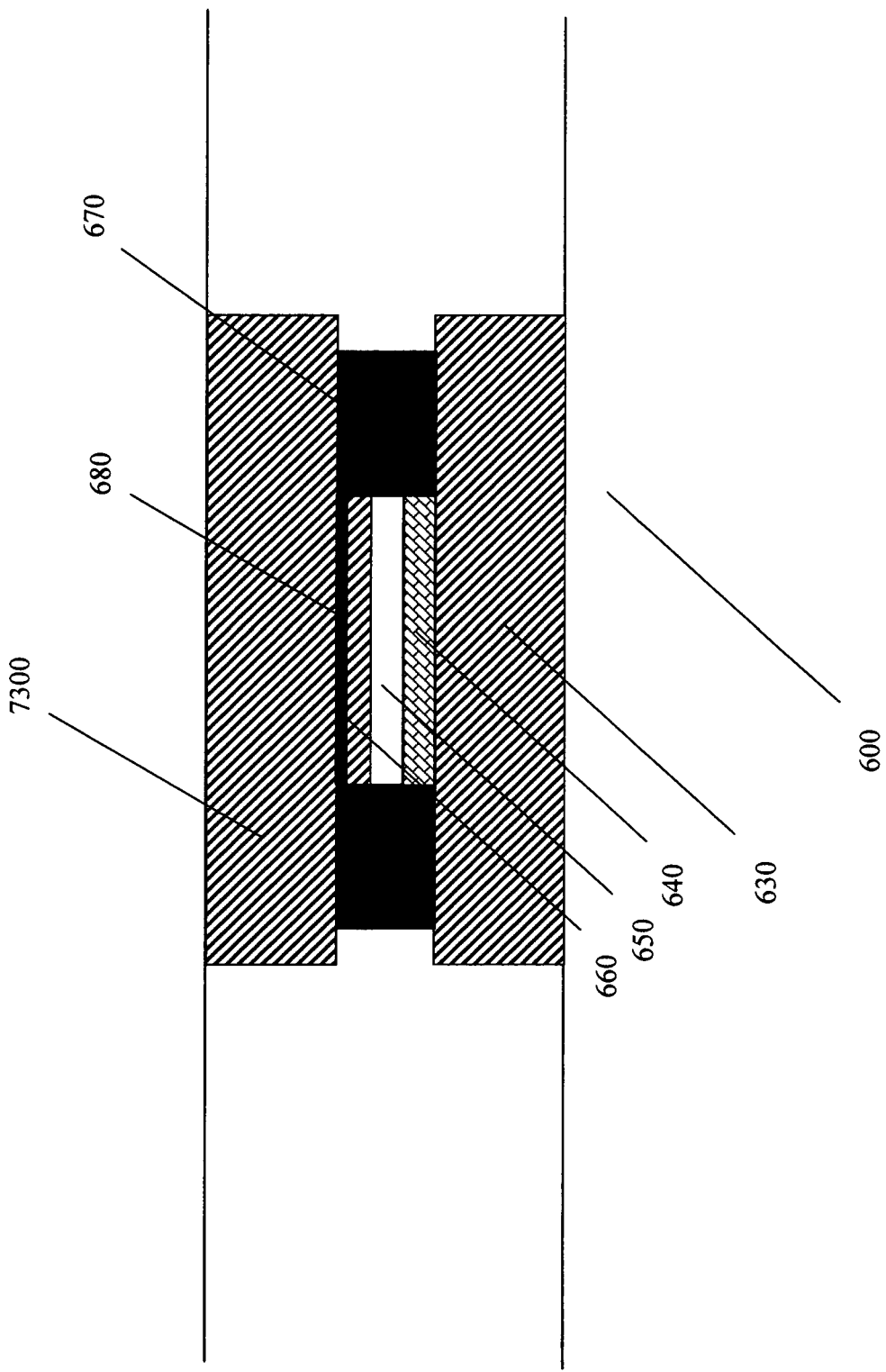
FIG. 19 is a cross sectional view of the completed device after the formation and cooling of the alloy bond

The bonded assembly can then be cooled and removed from the bonding chamber. The individual devices may then be separated by sawing, or otherwise singulating the devices from the rest of the wafer. FIG. 19 illustrates the condition of the device after the alloying and cooling step.

Figure 20:
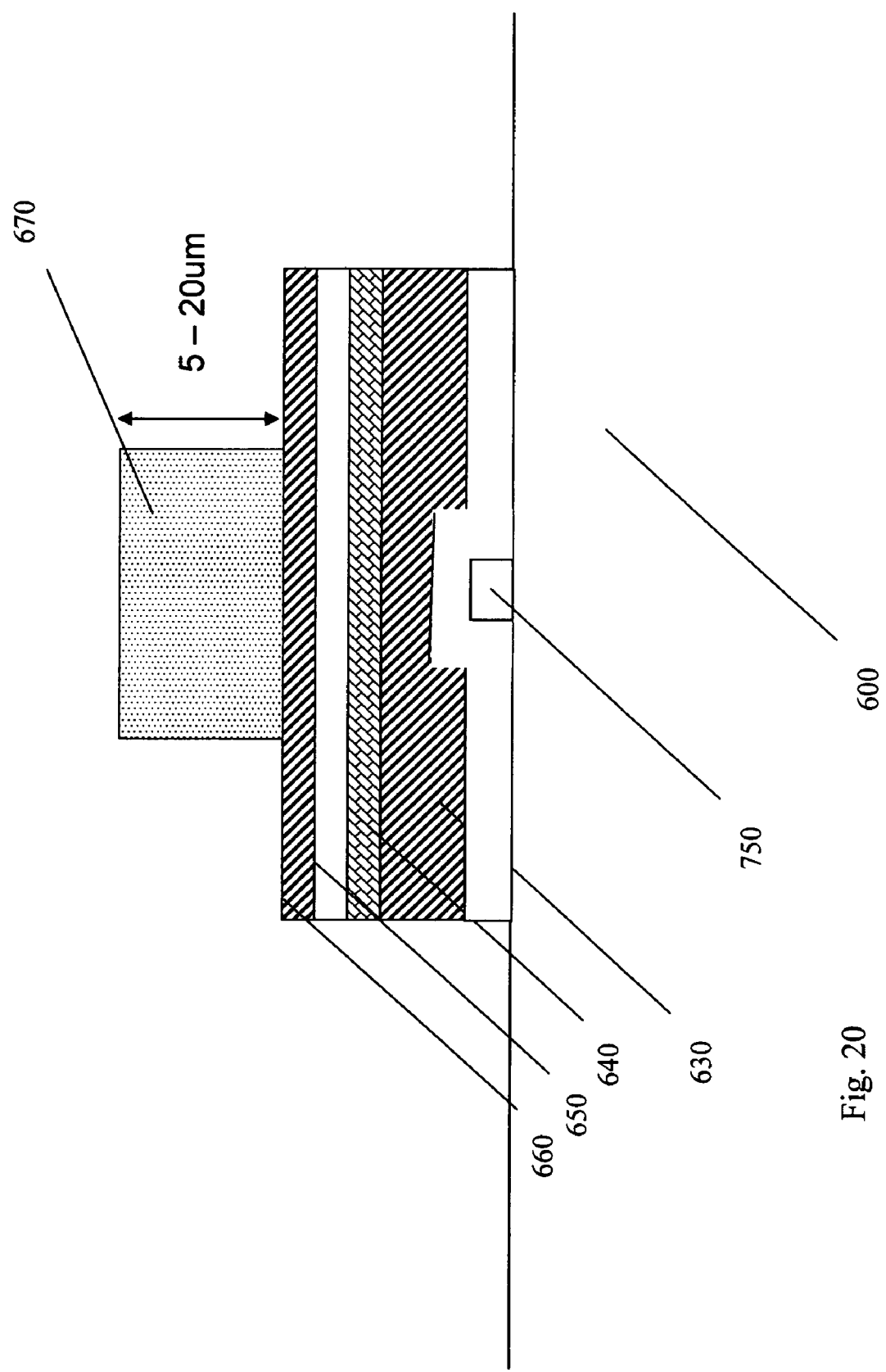
FIG. 20 is a cross sectional view showing and the combination of the metal alloy bond and keeper layer with the raised feature.

FIG. 20 is a cross sectional illustration of the combination of the above described metal alloy bond with keeper layer method with the raised feature described above. The raised feature 750 may be formed using any of the methods described above with respect to raised features 5050, 7050, 7060, 8050, 8060, or 9050. The raised feature provides the benefits described above with respect to enhancing the hermeticity of the metal alloy bond by ensuring the presence of the proper alloy stoichiometry at some point along the bond line. It should be understood that although the raised feature is shown under the first layer of the first metal and under the keeper layer, it may instead be formed on the other substrate 7000 and second layer of the first metal 7300. That is, the raised feature may first be formed on the substrate that will not have the keeper layer.

Figure 21:
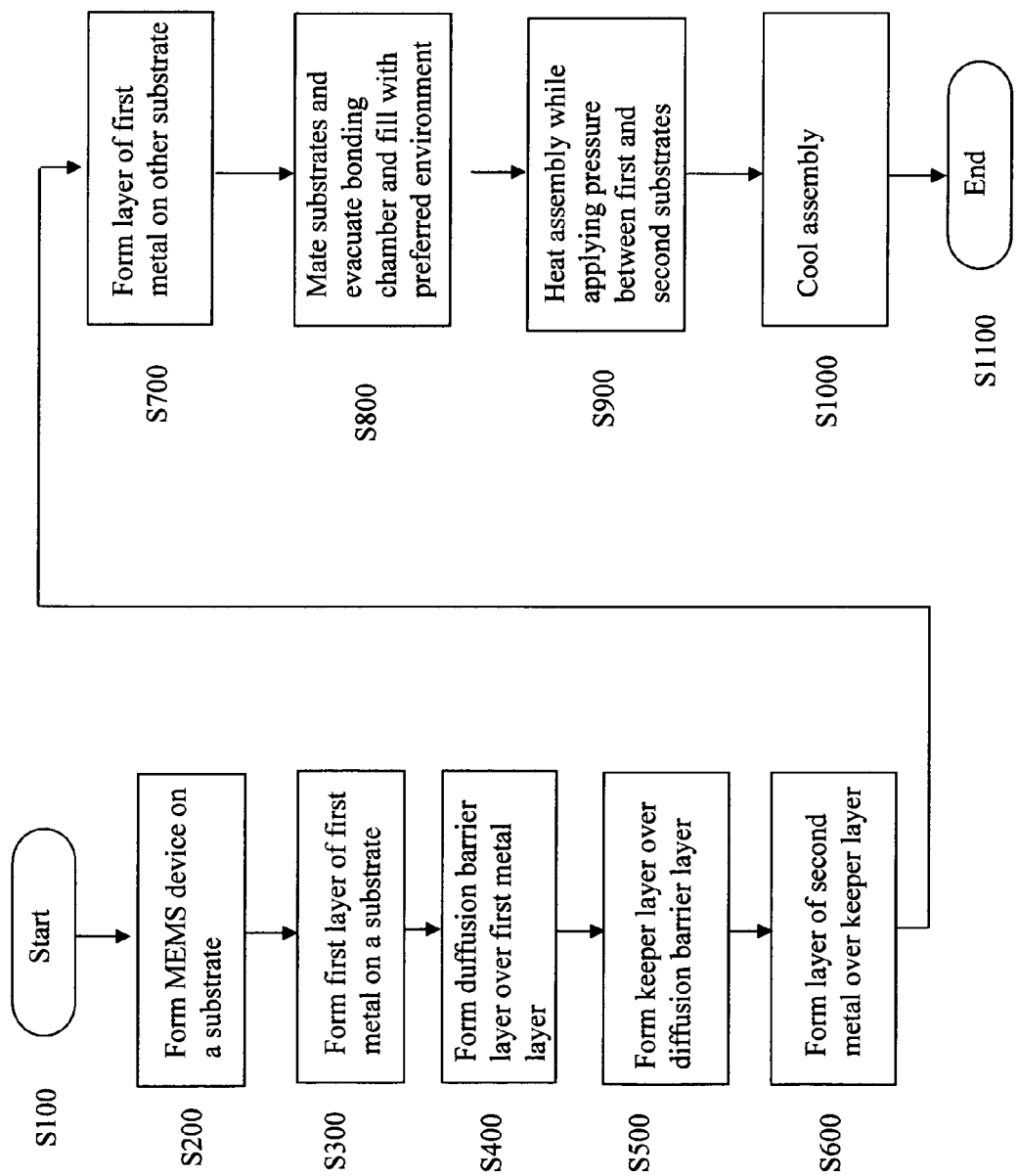
FIG. 21 is an exemplary embodiment of a method for manufacturing an encapsulated MEMS device with metal alloy hermetic seal and keeper layer.

FIG. 21 illustrates an exemplary embodiment of a method for manufacturing the device with wafer level hermetic bond using metal alloy with keeper layer. The method begins in step S100 and proceeds to step S200, wherein the MEMS device is formed on a first substrate. It should be understood that the raised feature may used in this process. If used, the raised feature may be formed simultaneously with, or even before, the MEMS device, or whenever it may conveniently be implemented in the process, before the metal layers are deposited and the substrates are bonded. If used, the raised feature may be formed substantially in a perimeter around the device. In step S300, a first layer of the first metal is formed on at least one of the first and the second substrates. If used, this first layer may be formed over the raised feature. In step S400, a diffusion barrier layer is formed on the first layer of the first metal. In various exemplary embodiments, the diffusion barrier layer comprises nickel, although it should be understood that other materials may be chosen, as long as the material is immiscible with the first metal at the bonding temperature described below. In step S500, a thin "keeper" layer of the first metal layer is formed over the diffusion barrier layer. In step S600, a layer of a second metal layer is formed over the keeper layer. The thickness of the keeper layer is such that the material will be exhausted before all of the second metal is incorporated into the alloy.

In step S700, the layer of the first metal is formed on the other substrate. At this point, or after step S600, the substrates may be heated to remove any volatile materials, such as contaminants or organic compounds which may otherwise interfere with bonding, or with the long-term functioning of the device. The first substrate is assembled with the second substrate by, for example, disposing their mating surfaces against one another, and the bonding chamber may be evacuated in step S800. In step S800, a chamber containing the assembled substrates is filled with the desired environment. Exemplary environments include gases which are at least one of thermally insulating and electrically insulating, such as $SF_6$, He, $CCl_2F_2$, $C_2Cl_2F_4$ and $N_2$, vacuum and partial vacuum.

In step S900, the assembly is heated while applying pressure between the first and the second substrates. In step S1000, the assembly is cooled to form the hermetic seal around the MEMS device. The process ends in step S1100.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes the formation of a gold/indium alloy, it should be understood that the systems and methods described herein may be applied to any number of different alloy systems, or solid-liquid interdiffusion bonding systems, in addition to $AuIn_x$. Furthermore, while a specific nickel diffusion barrier layer is described in the exemplary embodiments, it should be understood that other materials may be chosen, depending on the application. Although a method is disclosed for manufacturing the encapsulated MEMS device, it should be understood that this method is exemplary only, and that the steps need not be performed in the order shown, and may be adapted to produce any embodiment described herein or other embodiments encompassed. Accordingly, the exemplary implementations set forth above, are intended to be illustrative, not limiting.

What is claimed is:

1. A method for encapsulating a device with a hermetic seal comprising:
    forming a device on a first substrate or a second substrate;
    forming a first layer of a first metal over a bonding surface of at least one of the first substrate and a second substrate;
    forming a keeper layer of the first metal over the first layer of the first metal, wherein the keeper layer is substantially thinner than the first layer of the first metal;
    forming a layer of a second metal over the keeper layer, wherein the layer of the second metal is substantially thicker than the keeper layer;
    forming a raised feature raised feature comprising a material which maintains its rigidity at the process temperature, and is disposed in at least a portion of a perimeter around the device and protruding from the bonding surface and into at least one of the first layer and a second layer of the first metal on the at least one of the first and the second substrate; and
    forming a second layer of the first metal on the other substrate not having the first layer of the first metal;
    coupling the first substrate to the second substrate; and
    heating the first and second substrates to form an alloy of the first metal and the second metal, by heating to the bonding temperature, wherein the bonding temperature is higher than the melting point of at least one of the first metal and the second metal, wherein the alloy is disposed over and around the raised feature; to encapsulate the device in a substantially hermetic seal formed by the alloy.

2. The method of claim 1, further comprising:
    forming a raised feature before forming the first layer or the second layer of the first metal on the at least one of the first and the second substrate.

3. The method of claim 1, further comprising:
    forming a diffusion barrier layer of a second material over the first layer, wherein the second material is immiscible in the first metal at a bonding temperature; and
    removing a portion of the diffusion barrier layer and the second keeper layer, so that at least a portion of a surface of the first layer of the first metal is exposed.

4. The method of claim 3, further comprising forming an adhesion layer over the first layer of the first metal, and forming the diffusion barrier layer over the adhesion layer, wherein the adhesion layer promotes the adhesion of the overlying diffusion barrier layer to the underlying first layer of the first metal.

5. The method of claim 3, wherein the diffusion barrier layer is nickel, the first metal is gold, and the second metal is indium wherein the first layer of gold is at least about 1 μm thick and about 100 μm wide, and forms substantially a continuous perimeter around the device.

6. The method of claim 5, wherein the environment comprises at least one of $SF_6$, He, $CCl_2F_2$, $C_2Cl_2F_4$ and $N_2$, vacuum and partial vacuum.

7. The method of claim 5, wherein the keeper layer is gold formed to a thickness of less than about 0.1 μm.

8. The method of claim 5, wherein the alloy is $AuIn_x$, where x is about 2.

9. The method of claim 1, further comprising heating the first substrate and the second substrate to a temperature sufficient to desorb contaminants from the layers, before coupling the first substrate to the second substrate.

10. The method of claim 9, wherein the heating step also forms an alloy comprising the second metal and the keeper layer, before coupling the first substrate to the second substrate.

11. The method of claim 1, further comprising:
    evacuating a chamber containing the first substrate and the second substrate; and
    establishing within the chamber an environment, wherein the environment is at least one of thermally insulating and electrically insulating.

12. The method of claim 1, wherein the first layer defines a substantially continuous perimeter around the device.

13. An encapsulated device with a hermetic seal, comprising:
    a device on a first substrate or a second substrate;
    a first layer of a first metal formed over a bonding surface of at least one of the first substrate and a second substrate;

a diffusion barrier layer of a second material over the first layer, wherein the second material is immiscible in the first metal at a process temperature;

a raised feature comprising a material which maintains its rigidity at the process temperature, and is disposed in at least a portion of a perimeter around the device and protruding from the bonding surface and into at least one of the first layer and a second layer of the first metal on the at least one of the first and the second substrate; and, an alloy of the first metal and a second metal, formed over and adjacent to both sides of the diffusion barrier layer, wherein the alloy is disposed over and around the raised feature; the alloy coupling the first substrate to the second substrate and encapsulating the device with a hermetic seal, wherein the bonding temperature is a melting point of at least one of the first metal and the second metal.

14. The encapsulated device of claim 13, wherein the first metal comprises gold and the second metal comprises indium, and the alloy is $AuIn_x$, wherein x is about 2.

15. The encapsulated device of claim 14, wherein the first layer of gold is at least about 1 μm thick and about 100 μm wide, and forms a perimeter around the device.

16. The encapsulated device of claim 15, wherein the alloy is between about 4 μm and about 6 μm thick.

17. The encapsulated device of claim 13, further comprising an adhesion layer between the diffusion barrier layer and the first layer of the first metal, and wherein the diffusion barrier layer comprises nickel, at a thickness of about 0.1 μm, and the adhesion barrier layer comprises tungsten-titanium.

18. The encapsulated device of claim 13, wherein at least one of the first and the second substrate is at least one of amorphous silicon, crystalline silicon, glass, quartz, sapphire, and metal.

19. The encapsulated device of claim 13, further comprising:

an environment hermetically encapsulated with the device, the environment being at least one of substantially thermally insulating and substantially electrically insulating.

20. The encapsulated device of claim 19, wherein the environment comprises at least one of $SF_6$, He, $CCl_2F_2$, $C_2Cl_2F_4$ and $N_2$, vacuum and partial vacuum.

21. An encapsulated device with a hermetic seal, comprising:

a device on a first substrate or a second substrate;

a first layer of a first metal formed over a bonding surface of at least one of the first substrate and a second substrate;

a diffusion barrier layer of a second material over the first layer, wherein the second material is immiscible in the first metal at a process temperature;

a raised feature comprising a material which maintains its rigidity at the process temperature, and disposed around the device and protruding from the bonding surface and into at least one of the first layer and a second layer of the first metal on the at least one of the first and the second substrate, wherein the alloy is disposed over and around the raised feature; and another layer of the first metal on the other substrate without the diffusion barrier layer; and an alloy of the first metal and a second metal, formed over and adjacent to both sides of the diffusion barrier layer, wherein the alloy is disposed over and around the raised feature; the alloy coupling the first substrate to the second substrate and encapsulating the device with a hermetic seal, wherein the process temperature is a melting point of at least one of the first metal and the second metal.

* * * * *